United States Patent
Katsuyama

(10) Patent No.: US 9,235,002 B2
(45) Date of Patent: Jan. 12, 2016

(54) INTEGRATED SEMICONDUCTOR DEVICE

(71) Applicant: SUMITOMO ELECTRIC INDUSTRIES, LTD., Osaka-shi, Osaka (JP)

(72) Inventor: Tomokazu Katsuyama, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 32 days.

(21) Appl. No.: 13/680,437

(22) Filed: Nov. 19, 2012

(65) Prior Publication Data

US 2013/0129277 A1 May 23, 2013

(30) Foreign Application Priority Data

Nov. 21, 2011 (JP) ................. 2011-254141

(51) Int. Cl.
*G02B 6/12* (2006.01)
*G02B 6/125* (2006.01)
*G02B 6/43* (2006.01)
(Continued)

(52) U.S. Cl.
CPC ............ *G02B 6/125* (2013.01); *B82Y 20/00* (2013.01); *G02B 6/12* (2013.01); *G02B 6/43* (2013.01); *H01S 5/026* (2013.01); *H01S 5/0265* (2013.01); *H01S 5/4031* (2013.01); *G02B 6/12004* (2013.01); *G02B 2006/12097* (2013.01); *H01S 5/22* (2013.01); *H01S 5/34306* (2013.01)

(58) Field of Classification Search
CPC ........ G02B 6/12; G02B 6/43; G02B 6/12097; G02B 2006/12097

USPC ............................................... 385/14
See application file for complete search history.

(56) References Cited

U.S. PATENT DOCUMENTS 5,790,580 A * 8/1998 Sakata et al. ............. 372/50.121
7,340,142 B1 * 3/2008 Shinoda et al. ............... 385/129
(Continued)

FOREIGN PATENT DOCUMENTS

JP 7-263655 10/1995
JP H09-293927 11/1997
(Continued)

OTHER PUBLICATIONS

Notification of Reasons for Rejection dispatched Jul. 7, 2015 and partial translation thereof.

*Primary Examiner* — Ryan Lepisto
*Assistant Examiner* — Mary El Shammaa
(74) *Attorney, Agent, or Firm* — Smith, Gambrell & Russell LLP.

(57) ABSTRACT

An integrated semiconductor device includes a substrate including a first portion, a second portion, and a third portion; a first waveguide provided on the first portion, the first waveguide including a base portion and a ridge portion provided on the base portion, the base portion containing a first core layer; a second waveguide provided on the second portion, the second waveguide including a first stripe-shaped mesa containing a second core layer; and a third waveguide provided on the third portion, the third waveguide including a second stripe-shaped mesa containing a third core layer. The first stripe-shaped mesa is connected to the base portion and the ridge portion. The first stripe-shaped mesa is connected to the second stripe-shaped mesa. The second core layer is formed integrally with the first core layer. The third core layer is joined to the second core layer by a butt-joint method.

9 Claims, 21 Drawing Sheets

(51) Int. Cl.
*H01S 5/026* (2006.01)
*H01S 5/40* (2006.01)
*B82Y 20/00* (2011.01)
*H01S 5/22* (2006.01)
*H01S 5/343* (2006.01)

(56) References Cited

U.S. PATENT DOCUMENTS 7,474,817 B2 * 1/2009 Nunoya et al. .................. 385/14
7,474,819 B2   1/2009 Koitabashi 2002/0141682 A1 * 10/2002 Ryu et al. ........................ 385/14
2005/0220391 A1 * 10/2005 Hashimoto et al. ............. 385/14
2008/0199128 A1 *  8/2008 Tanaka et al. ................... 385/14
2008/0317422 A1 * 12/2008 Kitatani et al. ................. 385/129

FOREIGN PATENT DOCUMENTS

| JP | 2002-374035 | 12/2002 |
| JP | 2008-66703  | 3/2008  |
| JP | 2010-226062 | 10/2010 |

* cited by examiner

INTEGRATED SEMICONDUCTOR DEVICE

BACKGROUND OF THE INVENTION

1. Field of the Invention

The present invention relates to an integrated semiconductor device.

2. Description of the Related Art

Japanese Unexamined Patent Application Publication No. 7-263655 discloses an integrated optical device including a laser diode and an optical modulator integrated on a semiconductor substrate. Each of the laser diode and the optical modulator has a stripe-shaped mesa structure. The mesa structure in each of the laser diode and the optical modulator has an optical waveguide structure including a core layer. The core layer of the laser diode and the core layer of the optical modulator are optically coupled with each other by a butt-joint method (butt-joint coupling).

A ridge waveguide and a mesa waveguide are well-known as a waveguide of semiconductor optical device. The ridge waveguide includes a ridge portion provided on a base portion. In the ridge waveguide, a core layer is included in the base portion. The mesa waveguide includes a semiconductor mesa. In the mesa waveguide, a core layer is included in the semiconductor mesa. As described in Japanese Unexamined Patent Application Publication No. 7-263655, the laser diode and the optical modulator have the same waveguide structure of the mesa structure.

SUMMARY OF THE INVENTION

However, each of optical devices in an integrated optical device has a suitable configuration of the waveguide structure to obtain excellent properties of each optical device. For example, when the optical device is a light-emitting device such as a laser diode (LD), the ridge waveguide is preferably used to obtain high reliability. On the other hand, when the optical device is an optical modulator, the mesa waveguide is preferably used to obtain high-frequency modulation characteristics. However, in the conventional integrated optical device, the laser diode and the optical modulator have the same waveguide structure, as described above. The reason the same mesa waveguide structure is used in the conventional integrated optical device is that the production is easily performed and that the butt-joint connection between the core layers in the laser diode and the optical modulator is easily established. On the other hand, when a light-emitting device and an optical modulator having different waveguide structures are integrated on a single substrate, it is difficult to obtain a high optical coupling efficiency between the mesa waveguide and the ridge waveguide. Furthermore, the reliability of the device may be degraded.

Accordingly, an integrated semiconductor device according to an embodiment of the present invention includes a substrate including a first portion, a second portion, and a third portion arranged in that order in a predetermined direction; a first waveguide provided on the first portion, the first waveguide including a base portion and a ridge portion provided on the base portion, the base portion containing a first core layer, the ridge portion extending in the predetermined direction; a second waveguide provided on the second portion, the second waveguide including a first stripe-shaped mesa containing a second core layer and extending in the predetermined direction; and a third waveguide provided on the third portion, the third waveguide including a second stripe-shaped mesa containing a third core layer and extending in the predetermined direction. The first stripe-shaped mesa is connected to the base portion and the ridge portion at one end of the first stripe-shaped mesa. The first stripe-shaped mesa is connected to the second stripe-shaped mesa at other end of the first stripe-shaped mesa. In addition, the second core layer is formed integrally with the first core layer. The third core layer is joined to the second core layer by a butt-joint method.

In the integrated semiconductor device according to an embodiment of the present invention, preferably, the first portion of the substrate includes a first region, a second region, and a third region arranged in that order in a direction intersecting with the predetermined direction. The base portion and the first core layer are provided on the first region, the second region, and the third region. The ridge portion is provided on the second region.

In the integrated semiconductor device according to an embodiment of the present invention, preferably, the first core layer includes an active layer. The first waveguide constitutes a light-emitting portion so as to generate light in the active layer. The second waveguide constitutes a waveguide portion so as to propagate light from the first waveguide to the third waveguide. In addition, the third waveguide constitutes an optical modulator portion so as to modulate light propagated from the first waveguide.

In the integrated semiconductor device described above, the first waveguide, the second waveguide, and the third waveguide are formed on the substrate. The first and third waveguides constitute a light-emitting portion and an optical modulator portion, respectively. The second waveguide provided between the first and third waveguides constitutes a waveguide portion so as to propagate light from the first waveguide to the third waveguide. The first waveguide has the base portion containing the first core layer and the ridge portion provided on the base portion. The first core layer is provided on the first region, the second region, and the third region of the first portion of the substrate. The ridge portion is provided on the second region. Thus, the first core layer is not contained in the ridge portion. The width of the first core layer is greater than that of the ridge portion. That is, in the integrated semiconductor device, the ridge waveguide is used as a waveguide for the light-emitting portion. Thus, in the light-emitting portion, the light-emitting region defined by the width of the ridge portion is not exposed at a side surface of the first core layer (a side surface of the base portion). In the integrated semiconductor device, it is thus possible to inhibit the degradation of the light-emitting region of the first core layer due to the exposure of the light-emitting region. Furthermore, it is possible to inhibit a reduction in emission properties due to the degradation of the light-emitting region. Hence, it is possible to ensure the light-emitting portion having satisfactory emission properties and high reliability. In the integrated semiconductor device, the third waveguide has the second stripe-shaped mesa. The second stripe-shaped mesa includes the third core layer. That is, in the integrated semiconductor device, the stripe-shaped mesa waveguide is used as a waveguide for the optical modulator portion. Thus, the mesa width of the second stripe-shaped mesa is controlled to adjust the width of the third core layer, thereby providing a single-mode optical waveguide. As a result, single-transverse-mode light can be suitably guided. In the integrated semiconductor device, it is thus possible to ensure properties of the optical modulator portion.

When the core layer of the laser diode and the core layer of the optical modulator are joined together by the butt-joint method as the semiconductor optical integrated device described in Japanese Unexamined Patent Application Publication No. 7-263655, abnormal growth may occur at the jointed portion. When a current is injected into the core layer to drive the laser diode, the current also flows into the abnormally grown portion. This may cause an increase in leakage current flowing to portions other than the active layer of the laser diode and a degradation in the reliability of the semiconductor optical integrated device described in Japanese Unexamined Patent Application Publication No. 7-263655.

In contrast, in the integrated semiconductor device according to an embodiment of the present invention, it is possible to inhibit the increase in leakage current and the degradation in the reliability of the device. That is, the integrated semiconductor device according to an embodiment of the present invention includes the second waveguide serving as a waveguide portion between the first waveguide and the third waveguide. The second waveguide includes the first stripe-shaped mesa containing the second core layer. That is, a stripe-shaped mesa waveguide is used as a waveguide for the waveguide portion. Furthermore, the second core layer and the first core layer are integrally formed, and the third core layer is joined to the second core layer by the butt-joint method. That is, the butt-jointed portion is provided not on the side of the ridge waveguide but on the side of the high-mesa waveguide. Thus, in the integrated semiconductor device, the butt-jointed portion is located at a position relatively remote from the first waveguide. Even when abnormal growth occurs at the butt-jointed portion, the current is less likely to flow into the abnormally grown portion. In the integrated semiconductor device, it is thus possible to inhibit the degradations of device properties and reliability due to a current flowing into the abnormally grown portion.

In the integrated semiconductor device according to an embodiment of the present invention, each of the substrate, the first core layer, and the second core layer may be composed of a III-V group compound semiconductor. The third core layer may be composed of a III-V group compound semiconductor containing Al. In the case where the core layer contains Al, the foregoing problems, such as the degradation in device reliability, become prominent. Thus, the structure of the integrated semiconductor device according to an embodiment of the present invention is more important.

In the integrated semiconductor device according to an embodiment of the present invention, preferably, the ridge portion has a width that is substantially constant at a first width in the predetermined direction. The second stripe-shaped mesa has a width that is substantially constant at a second width in the predetermined direction, the second width being smaller than the first width. The first stripe-shaped mesa includes a first mesa region and a second mesa region, the first and second mesa regions containing the one end and the other end of the first stripe-shaped mesa, respectively. The first mesa region has a width that is reduced from the first width to the second width in the predetermined direction. In addition, the second mesa region has a width that is substantially constant at the second width in the predetermined direction. In this case, the first mesa region functions as a mode matching section. It is thus possible to suppress the mismatch between the modes propagating in the first waveguide (that is the light-emitting portion) and the third waveguide (that is the optical modulator portion).

In the integrated semiconductor device according to an embodiment of the present invention, preferably, the ridge portion includes a first ridge region, and a second ridge region extending from the first ridge region to the one end of the first stripe-shaped mesa. The first ridge region has a width that is substantially constant at a first width in the predetermined direction. The second ridge region has a width that is reduced from the first width to a second width in the predetermined direction. The first stripe-shaped mesa includes a first mesa region and a second mesa region, the first and second mesa regions containing the one end and the other end of the first stripe-shaped mesa, respectively. The first mesa region has a width that is reduced from the second width to a third width in the predetermined direction. The second mesa region has a width that is substantially constant at the third width in the predetermined direction. In addition, the second stripe-shaped mesa has a width that is substantially constant at the third width in the predetermined direction. In this case, the second ridge region and the first mesa region function as a mode matching section. It is thus possible to suppress the mismatch between the modes propagating in the first waveguide and the third waveguide.

In the integrated semiconductor device according to an embodiment of the present invention, preferably, the first waveguide including the ridge portion and the second waveguide including the first stripe-shaped mesa are connected at a boundary that is located in the vicinity of a boundary between the first portion and the second portion. The second core layer and the third core layer are joined at a jointed portion by the butt-joint method, the jointed portion being located in the vicinity of a boundary between the second portion and the third portion. In addition, the jointed portion is provided at a different position from the boundary between the first waveguide and the second waveguide.

DESCRIPTION OF THE PREFERRED EMBODIMENTS

Figure 1:
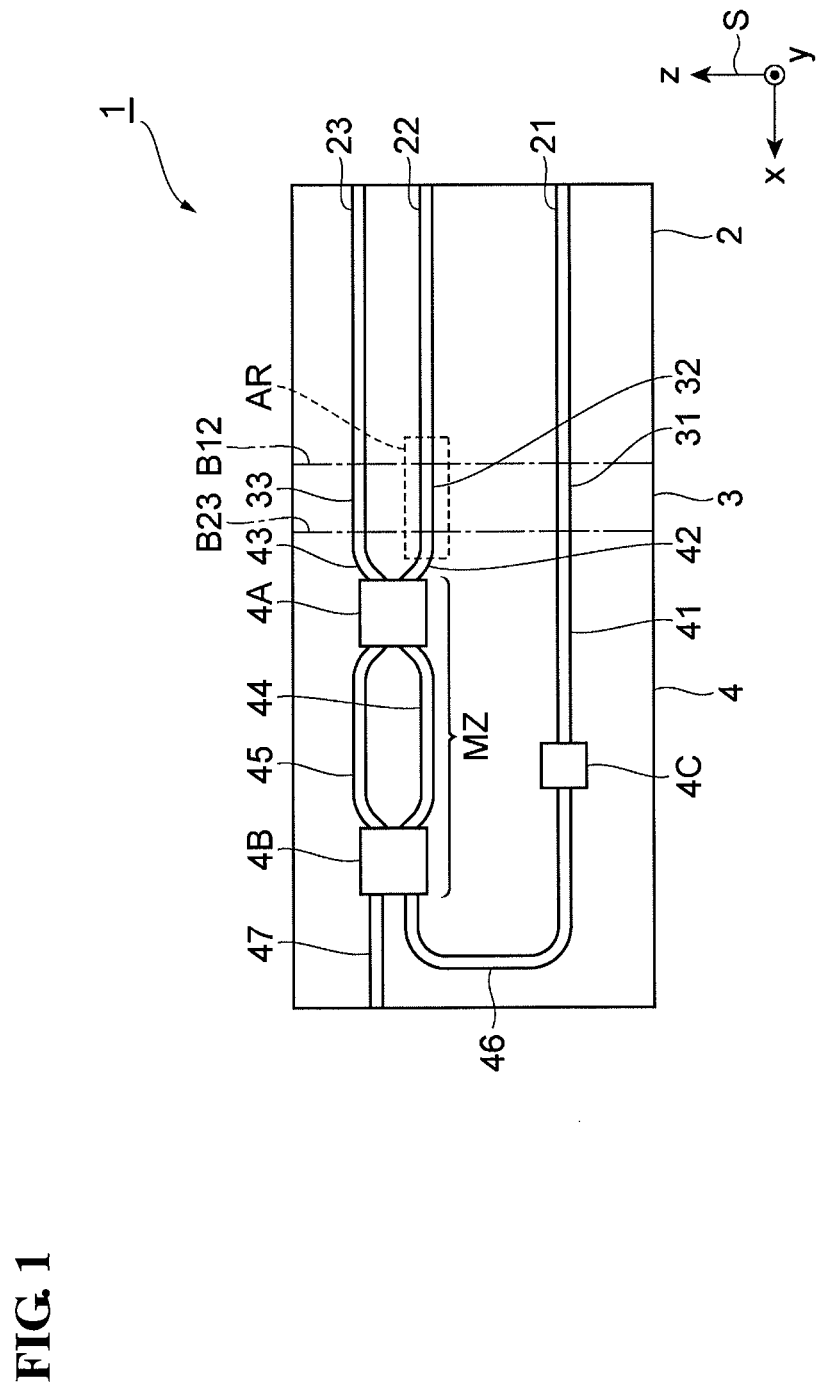
FIG. 1 is a plan view illustrating an integrated semiconductor device according to an embodiment of the present invention.

An integrated semiconductor device according to an embodiment of the present invention will be described in detail below with reference to the attached drawings. In the following figures, the same elements are designated using the same reference numerals, and descriptions are not redundantly repeated.

FIG. 1 is a plan view illustrating an integrated semiconductor device according to an embodiment of the present invention. In the following figures, a rectangular coordinate system S is illustrated. The x-axis of the rectangular coordinate system S represents a waveguiding direction of light in a semiconductor laser portion and a waveguide portion. The y-axis of the rectangular coordinate system S represents a direction orthogonal to a main surface a substrate of an integrated semiconductor device 1 and represents the thickness direction of the integrated semiconductor device 1. The z-axis of the rectangular coordinate system S represents a direction orthogonal to the x- and y-axes.

As illustrated in FIG. 1, the integrated semiconductor device 1 includes a semiconductor laser portion (light-emitting portion) 2, a waveguide portion 3, and an optical modulator portion 4. The semiconductor laser portion 2, the waveguide portion 3, and the optical modulator portion 4 are arranged in that order in a predetermined direction (here, the x-axis direction).

The semiconductor laser portion 2 generates light. The semiconductor laser portion 2 is composed of a distributed feedback (DFB) laser, for example. The waveguide portion 3 guides light from the semiconductor laser portion 2 to the optical modulator portion 4. The optical modulator portion 4 modulates the light from the waveguide portion 3. The optical modulator portion 4 is composed of a Mach-Zehnder optical modulator, for example.

The semiconductor laser portion 2 includes first waveguides 21 to 23. Each of the first waveguides 21 to 23 extends in the x-axis direction. The first waveguides 21 to 23 are arranged in that order in a direction intersecting with the x-axis direction (here, the z-axis direction). The first waveguides 21 to 23 are substantially parallel to one another. The distance between the first waveguide 21 and the first waveguide 22 is greater than that between the first waveguide 22 and the first waveguide 23.

The waveguide portion 3 includes second waveguides 31 to 33. Each of the second waveguides 31 to 33 extends in the x-axis direction. The second waveguides 31 to 33 are arranged in that order in the z-axis direction. The second waveguides 31 to 33 are substantially parallel to one another. The distance between the second waveguide 31 and the second waveguide 32 is greater than that between the second waveguide 32 and the second waveguide 33. An end of the second waveguide 31 is connected to an end of the first waveguide 21. An end of the second waveguide 32 is connected to an end of the first waveguide 22. An end of the second waveguide 33 is connected to an end of the first waveguide 23.

The optical modulator portion 4 includes optical couplers 4A and 4B arranged in that order in the x-axis direction. The optical couplers 4A and 4B are, for example, 2×2 multimode interference (MMI) couplers. The optical modulator portion 4 includes third waveguides 41 to 43. The third waveguides 41 to 43 are arranged in that order in the z-axis direction. An end of the third waveguide 41 is connected to the other end of the second waveguide 31. An end of the third waveguide 42 is connected to the other end of the second waveguide 32. The other end of the third waveguide 42 is connected to the optical coupler 4A. An end of the third waveguide 43 is connected to the other end of the second waveguide 33. The other end of the third waveguide 43 is connected to the optical coupler 4A.

The optical modulator portion 4 includes fourth waveguides 44 and 45. The fourth waveguides 44 and 45 are arranged in that order in the z-axis direction. An end of each of the fourth waveguides 44 and 45 is connected to the optical coupler 4A. The other end of each of the fourth waveguides 44 and 45 is connected to the optical coupler 4B. The optical couplers 4A and 4B and the fourth waveguides 44 and 45 constitute, for example, a Mach-Zehnder optical modulator MZ.

The optical modulator portion 4 includes fifth waveguides 46 and 47 and a monitor photodiode (PD) 4C. An end of each of the fifth waveguides 46 and 47 is connected to the optical coupler 4B. The other end of the fifth waveguide 46 is connected to the monitor PD 4C. The monitor PD 4C is connected to the other end of the third waveguide 41. The other end of the fifth waveguide 47 reaches an end face of the integrated semiconductor device 1.

In the integrated semiconductor device 1 having the foregoing structure, laser light generated in the semiconductor laser portion 2 propagates through the first waveguides 22 and 23, the second waveguides 32 and 33, and the third waveguides 42 and 43 in that order to enter the optical coupler 4A. The laser light emitted from the optical coupler 4A is incident on the optical coupler 4B through the fourth waveguides 44 and 45. Part of the laser light emitted from the optical coupler 4B propagates through the fifth waveguide 47 and is transmitted to the outside of the integrated semiconductor device 1. The remainder of the laser light emitted from the optical coupler 4B propagates through the fifth waveguide 46, and enters the monitor PD 4C. And then, the reminder of the laser light propagates through the third waveguide 41, the second waveguide 31, and the first waveguide 21 in that order and is transmitted to the outside of the integrated semiconductor device 1.

Figure 2:
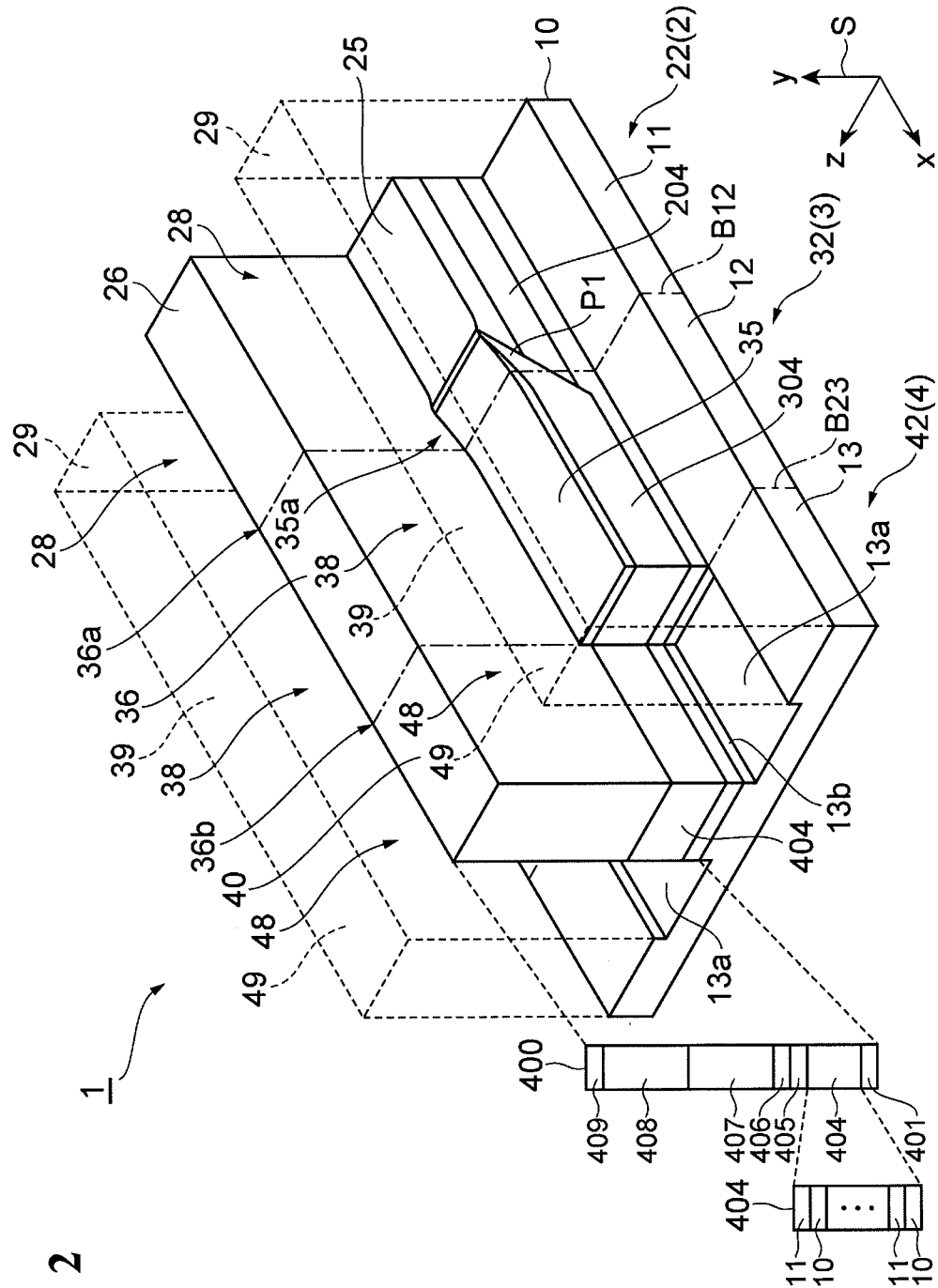
FIG. 2 is an enlarged perspective view of a region AR illustrated in FIG. 1.
Figure 3:
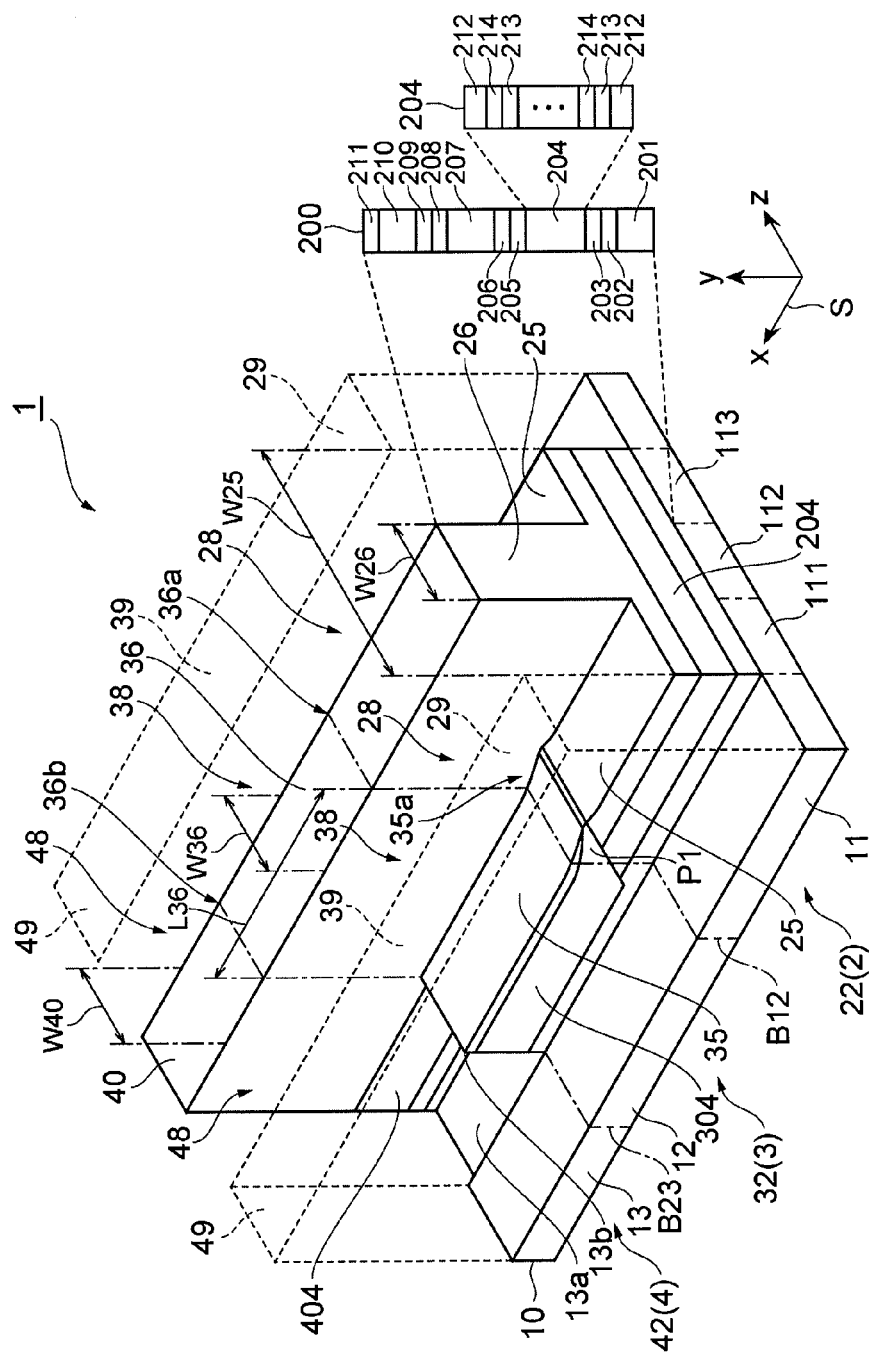
FIG. 3 is an enlarged perspective view of the region AR illustrated in FIG. 1.

The integrated semiconductor device 1 will be described in detail below. FIGS. 2 and 3 are enlarged perspective views of the region AR illustrated in FIG. 1. FIGS. 2 and 3 illustrate the first waveguide 22 of the semiconductor laser portion 2, the second waveguide 32 of the waveguide portion 3, and the third waveguide 42 of the optical modulator portion 4. In FIGS. 2 and 3, terrace portions are indicated by dashed lines.

As illustrated in FIGS. 2 and 3, the integrated semiconductor device 1 includes a semiconductor substrate 10. The semiconductor substrate 10 includes a first portion 11, a second portion 12, and a third portion 13 arranged in that order in the x-axis direction. The first portion 11 includes a first region 111, a second region 112, and a third region 113 arranged in that order in a direction intersecting with the x-axis direction (here, in the z-axis direction). In the second portion 12 of the semiconductor substrate 10, a pair of recessed portions 12a each extending in the x-axis direction are provided at positions corresponding to the first region 111 and the third region 113 of the first portion 11. In other words, in the second portion 12, a protruding portion 12b extending in the x-axis direction is provided at a position corresponding to the second region 112 of the first portion 11.

In the third portion 13 of the semiconductor substrate 10, a pair of recessed portions 13a each extending in the x-axis direction are provided at positions corresponding to the recessed portions 12a of the second portion 12. In other words, in the third portion 13, a protruding portion 13b extending in the x-axis direction is provided at a position corresponding to the protruding portion 12b of the second portion 12. The recessed portions 12a and the recessed portions 13a are integrally formed. The protruding portion 12b and the protruding portion 13b are integrally formed. The semiconductor substrate 10 has a first conductivity type (e.g., n-type). The semiconductor substrate 10 is composed of a III-V group compound semiconductor, such as InP. The semiconductor substrate 10 is doped with tin (Sn) as an n-type dopant, for example.

The semiconductor laser portion 2 and the first waveguide 22 are provided on the first portion 11 of the semiconductor substrate 10. The first waveguide 22 includes a base portion 25 provided in the first region 111, the second region 112, and the third region 113 of the first portion 11; and a ridge portion 26 provided in the second region 112 and on the base portion 25. The ridge portion 26 is arranged at the substantially center of the base portion 25 in the z-axis direction. The ridge portion 26 extends in the x-axis direction. The ridge portion 26 is defined by a pair of groove portions 28. The groove portions 28 are defined by a pair of terrace portions 29. The base portion 25 has a width W25 of, for example, about 10 μm to about 15 μm. The ridge portion 26 has a width W26 of, for example, about 1 μm to about 2 μm.

The base portion 25 and the ridge portion 26 of the first waveguide 22 have a stacked semiconductor structure 200 provided on the semiconductor substrate 10. The stacked semiconductor structure 200 is composed of a III-V group compound semiconductor and includes an active layer (first core layer) 204 configured to generate light (the stacked semiconductor structure 200 will be described in detail below). The active layer 204 is included in the base portion 25 and provided on the first region 111, the second region 112, and the third region 113. The width of the active layer 204 (i.e., the width W25 of the base portion 25) in the z-axis direction is greater than the width W26 of the ridge portion 26. As described above, the first waveguide 22 of the semiconductor laser portion 2 is a ridge waveguide.

The waveguide portion 3 and the second waveguide 32 are provided on the second portion 12 of the semiconductor substrate 10. The second waveguide 32 has a stripe-shaped mesa (first stripe-shaped mesa) 30. The stripe-shaped mesa 30 is provided on the protruding portion 12b of the semiconductor substrate 10. The stripe-shaped mesa 30 extends in the x-axis direction. The stripe-shaped mesa 30 is formed integrally with the base portion 25 and the ridge portion 26. Thus, one end 30a of the stripe-shaped mesa 30 is connected to the base portion 25 and the ridge portion 26. The other end 30b of the stripe-shaped mesa 30 is connected to a stripe-shaped mesa 40 of the third waveguide 42 of the optical modulator portion 4 described below. The stripe-shaped mesa 30 is defined by a pair of groove portions 38. The groove portions 38 are defined by a pair of terrace portions 39. The mesa width W30 of the stripe-shaped mesa 30 is substantially the same as the width W26 of the ridge portion 26.

The stripe-shaped mesa 30 has a stacked semiconductor structure provided on the semiconductor substrate 10. The stacked semiconductor structure has the same structure as the stacked semiconductor structure 200 of the semiconductor laser portion 2. Thus, the stripe-shaped mesa 30 includes a core layer (second core layer) 304 composed of a III-V group compound semiconductor. Semiconductor layers in the stacked semiconductor structure of the stripe-shaped mesa 30 are formed integrally with semiconductor layers in the stacked semiconductor structure 200. Thus, the core layer 304 of the waveguide portion 3 is formed integrally (continuously) with the active layer 204 of the semiconductor laser portion 2.

The width of the core layer 304 in the z-axis direction is substantially the same as the mesa width W30 of the stripe-shaped mesa 30. As described above, the second waveguide 32 of the waveguide portion 3 is a high-mesa waveguide. The length of the stripe-shaped mesa 30 (i.e., the length L30 of the waveguide portion 3 and the second waveguide 32) in the x-axis direction is, for example, about 10 μm.

The optical modulator portion 4 and the third waveguide 42 are provided on the third portion 13 of the semiconductor substrate 10. The third waveguide 42 has the stripe-shaped mesa (second stripe-shaped mesa) 40. The stripe-shaped mesa 40 is provided on the protruding portion 13b of the semiconductor substrate 10. The stripe-shaped mesa 40 extends in the x-axis direction. The stripe-shaped mesa 40 is defined by a pair of groove portions 48. The groove portions 48 are defined by a pair of terrace portions 49. The mesa width W40 of the stripe-shaped mesa 40 is substantially the same as the mesa width W30. The groove portions 28, 38, and 48 are integrally formed so as to have substantially the same width. The terrace portions 29, 39, and 49 are integrally formed so as to have substantially the same width.

The stripe-shaped mesa 40 has a stacked semiconductor structure 400 provided on the semiconductor substrate 10. The stacked semiconductor structure 400 is composed of a III-V group compound semiconductor and includes a core layer (third core layer) 404 configured to modulate light (the stacked semiconductor structure 400 will be described in detail below). Thus, the stripe-shaped mesa 40 includes the core layer 404 composed of the III-V group compound semiconductor. The width of the core layer 404 in the z-axis direction is substantially the same as the mesa width W40 of the stripe-shaped mesa 40. As described above, the third waveguide 42 of the optical modulator portion 4 is a high-mesa waveguide.

Semiconductor layers in the stacked semiconductor structure 400 of the stripe-shaped mesa 40 are joined to semiconductor layers in the stacked semiconductor structure (stacked semiconductor structure 200) of the stripe-shaped mesa 30. In particular, the core layer 404 of the stripe-shaped mesa 40 is joined to the core layer 304 of the stripe-shaped mesa 30 by a butt-joint method. Thus, an abnormally grown portion P1 may be formed at the joint (butt-jointed portion) between the core layers 304 and 404.

Here, in the integrated semiconductor device 1, the ridge waveguides are used as the first waveguides 21 to 23 of the semiconductor laser portion 2 as described above. The high-mesa waveguides are used as the second waveguides 31 to 33 of the waveguide portion 3 and the third waveguides 41 to 43 of the optical modulator portion 4. Thus, a boundary between the ridge waveguides and the high-mesa waveguides is located in the vicinity of a boundary B12 between the first portion 11 and the second portion 12 of the semiconductor substrate 10 (boundary between the semiconductor laser portion 2 and the waveguide portion 3). The butt-jointed portion is located in a vicinity of a boundary B23 between the second portion 12 and the third portion 13 of the semiconductor substrate 10 (boundary between the waveguide portion 3 and the optical modulator portion 4). The butt-jointed portion (jointed portion) is provided at a different position from the boundary between the semiconductor laser portion 2 and the waveguide portion 3 (boundary between the ridge waveguide and the high-mesa waveguide).

The integrated semiconductor device 1 further includes a passivation film (not illustrated), a resin portion (not illustrated), and an electrode (not illustrated). The passivation film is provided on side faces of the ridge portion 26, surfaces of the stripe-shaped mesas 30 and 40, bottom faces of the groove portions 28, 38, and 48, and surfaces of terrace portions 29, 39, and 49. The passivation film has an opening on the upper surface of the ridge portion 26. The resin portion is provided on the passivation film. As with the passivation film, the resin portion has an opening on the upper portion of the ridge portion 26, so that the upper surface of the ridge portion 26 is exposed through the openings.

Thus, in the integrated semiconductor device 1, at least the side surfaces of the ridge portion 26 and the side surfaces of the stripe-shaped mesas 30 and 40 are buried by the resin portion. The electrode is electrically connected to the upper surface of the ridge portion 26 through the openings of the passivation film and the resin portion. For example, the electrode is used to inject a current into the active layer 204 of the semiconductor laser portion 2. The integrated semiconductor device 1 may further include another electrode formed on the stripe-shaped mesa 40 so as to apply a voltage to the optical modulator portion 4. In this case, each of the passivation film and the resin portion may further have an opening on the upper surface of the stripe-shaped mesa 40. The electrode formed on the stripe-shaped mesa 40 may be electrically connected to the upper surface of the stripe-shaped mesa 40 through the openings. Note that an opening is not provided on the stripe-shaped mesa 30.

An example of the stacked semiconductor structure 200 of the base portion 25 and the ridge portion 26 will be described in detail below. The stacked semiconductor structure 200 includes, for example, a buffer layer 201, a grating layer 202, a spacer layer 203, the active layer 204, a cladding layer 205, an etch-stop layer 206, a cladding layer 207, a side-etched layer 208, a capping layer 209, a cladding layer 210, and a contact layer 211 stacked in that order on the semiconductor substrate 10. In particular, the active layer 204 is contained in the base portion 25 and provided on the first region 111, the second region 112, and the third region 113 of the semiconductor substrate 10. The upper surface of the ridge portion 26 electrically connected to the electrode is a surface of the contact layer 211.

The buffer layer 201 has the first conductivity type (for example, n-type). The buffer layer 201 is composed of a III-V group compound semiconductor, such as InP. The buffer layer 201 has a thickness of, for example, about 500 nm. The grating layer 202 has the first conductivity type. The grating layer 202 is composed of a III-V group compound semiconductor, such as InGaAsP. The grating layer 202 has a thickness of, for example, about 80 nm. The grating layer 202 has a bandgap wavelength of, for example, about 1330 nm.

The spacer layer 203 has the first conductivity type. The spacer layer 203 is composed of a III-V group compound semiconductor, such as InP. The spacer layer 203 has a thickness of, for example, about 100 nm. When these layers 201 to 203 have n-type conductivity, for example, Si is used as a dopant therefor. Each of the layers 201 to 203 has an impurity concentration of, for example, about $5 \times 10^{17}$ cm$^{-3}$.

The active layer 204 is composed of a III-V group compound semiconductor, such as InGaAsP. The active layer 204 has a multi-quantum-well (MQW) structure in which, for example, barrier layers 213 and well layers 214 are alternately stacked. A pair of separate confinement heterostructure (SCH) layers 212 are provided on the top and bottom of the MQW structure. The number of layers of the barrier layers 213 may be seven layers. The number of layers of the well layers 214 may be seven layers. The barrier layers 213 are composed of, for example, InGaAsP. The barrier 213 has a bandgap wavelength of, for example, about 1200 nm. Each of the barrier layers 213 has a thickness of, for example, about 10 nm.

The well layers 214 are composed of, for example, InGaAsP. The well layer 214 has a compressive strain of about 1%. The well layer 214 has a thickness of, for example, about 5 nm. The SCH layers 212 are composed of, for example, InGaAsP. The SCH layer 212 has a bandgap wavelength of, for example, about 1150 nm. The SCH layer 212 has a thickness of, for example, about 50 nm. The active layer 204 has a total thickness of, for example, about 225 nm. The active layer 204 with the structure has a photoluminescence (PL) wavelength of, for example, about 1550 nm.

The cladding layer 205 has a second conductivity type (for example, p-type) different from the first conductivity type. The cladding layer 205 is composed of a III-V group compound semiconductor, such as InP. The cladding layer 205 has a thickness of, for example, about 60 nm. The etch-stop layer 206 has the second conductivity type. The etch-stop layer 206 is composed of a III-V group compound semiconductor, such as InGaAsP. The etch-stop layer 206 has a thickness of, for example, about 10 nm. The etch-stop layer 206 has a bandgap wavelength of, for example, about 1100 nm.

The cladding layer 207 has the second conductivity type. The cladding layer 207 is composed of a III-V group compound semiconductor, such as InP. The cladding layer 207 has a thickness of, for example, about 460 nm. The side-etched layer 208 has the second conductivity type. The side-etched layer 208 is composed of a III-V group compound semiconductor, such as InGaAsP. The side-etched layer 208 has a thickness of, for example, about 20 nm. The side-etched layer 208 has a bandgap wavelength of, for example, about 1150 nm.

The capping layer 209 has the second conductivity type. The capping layer 209 is composed of a III-V group compound semiconductor, such as InP. The capping layer 209 has a thickness of, for example, about 20 nm. When these layers 205 to 209 have p-type conductivity, for example, Zn may be used as a dopant therefor. Each of the layers 205 to 209 has an impurity concentration of, for example, about $5 \times 10^{17}$ cm$^{-3}$.

The cladding layer 210 has the second conductivity type. The cladding layer 210 is composed of a III-V group compound semiconductor, such as InP. The cladding layer 210 has a thickness of, for example, about 1200 nm. The cladding layer 210 has an impurity concentration of, for example, about $1 \times 10^{18}$ cm$^{-3}$. The contact layer 211 has the second conductivity type. The contact layer 211 is composed of a III-V group compound semiconductor, such as InGaAs. The contact layer 211 has a thickness of, for example, about 100 nm. The contact layer 211 has an impurity concentration of, for example, about $1.5 \times 10^{19}$ cm$^{-3}$. When these layers 210 and 211 have p-type conductivity, for example, Zn may be used as a dopant therefor.

Here, the stacked semiconductor structure of the stripe-shaped mesa 30 of the waveguide portion 3 is formed integrally with the stacked semiconductor structure 200 and has the same configuration as the stacked semiconductor structure 200, as described above. However, the stacked semiconductor structure of the stripe-shaped mesa 30 may not include the contact layer 211 because an electrode is not provided thereon.

An example of the stacked semiconductor structure 400 of the stripe-shaped mesa 40 will be described in detail below. The stacked semiconductor structure 400 includes, for example, a buffer layer 401, the core layer 404, a cladding layer 405, a cladding layer 406, and a contact layer 407 stacked in that order on the semiconductor substrate 10. The buffer layer 401 has the first conductivity type (for example, n-type). The buffer layer 401 is composed of a III-V group compound semiconductor, such as InP. The buffer layer 401 has a thickness of, for example, about 50 nm. When the buffer layer 401 has n-type conductivity type, for example, Si may be used as a dopant therefor.

The core layer 404 is composed of a III-V group compound semiconductor. The core layer 404 has a multi-quantum-well structure in which, for example, barrier layers 408 and well layers 409 are alternately stacked. The number of the barrier layers 408 may be 25 layers. The number of the well layers 409 may be 25 layers. The barrier layers 408 are composed of a III-V group compound semiconductor, such as AlInAs, lattice-matched to InP. The barrier layer 408 has a thickness of, for example, about 5 nm.

The well layers 409 are composed of a III-V group compound semiconductor, such as AlGaInAs, lattice-matched to InP. The well layer 409 has a bandgap wavelength of, for example, about 1480 nm. The well layer 409 has a thickness of, for example, about 10 nm. Thus, the core layer 404 has a thickness of, for example, about 380 nm. The core layer 404 having the foregoing structure is butt-joined to the core layer 304 of the waveguide portion 3 and optically coupled to the core layer 304, as described above.

The cladding layer 405 has the second conductivity type (for example, p-type). The cladding layer 405 is composed of a III-V group compound semiconductor, such as InP. The thickness of the cladding layer 405 is adjusted in such a manner that the upper surface of the cladding layer 405 is substantially flush with the upper surface of the capping layer 209 of the ridge portion 26 and the stripe-shaped mesa 30. The cladding layer 405 has an impurity concentration of, for example, about $5 \times 10^{17}$ cm$^{-3}$. When the cladding layer 405 has p-type conductivity type, for example, Zn may be used as a dopant therefor. The cladding layer 406 is formed integrally with the cladding layer 210 in the stacked semiconductor structure 200 of the ridge portion 26 and the stripe-shaped mesa 30 and has the same configuration as the cladding layer 210. The contact layer 407 is formed integrally with the contact layer 211 in the stacked semiconductor structure 200 of the ridge portion 26 and the stripe-shaped mesa 30 and has the same configuration as the contact layer 211.

Figure 4:
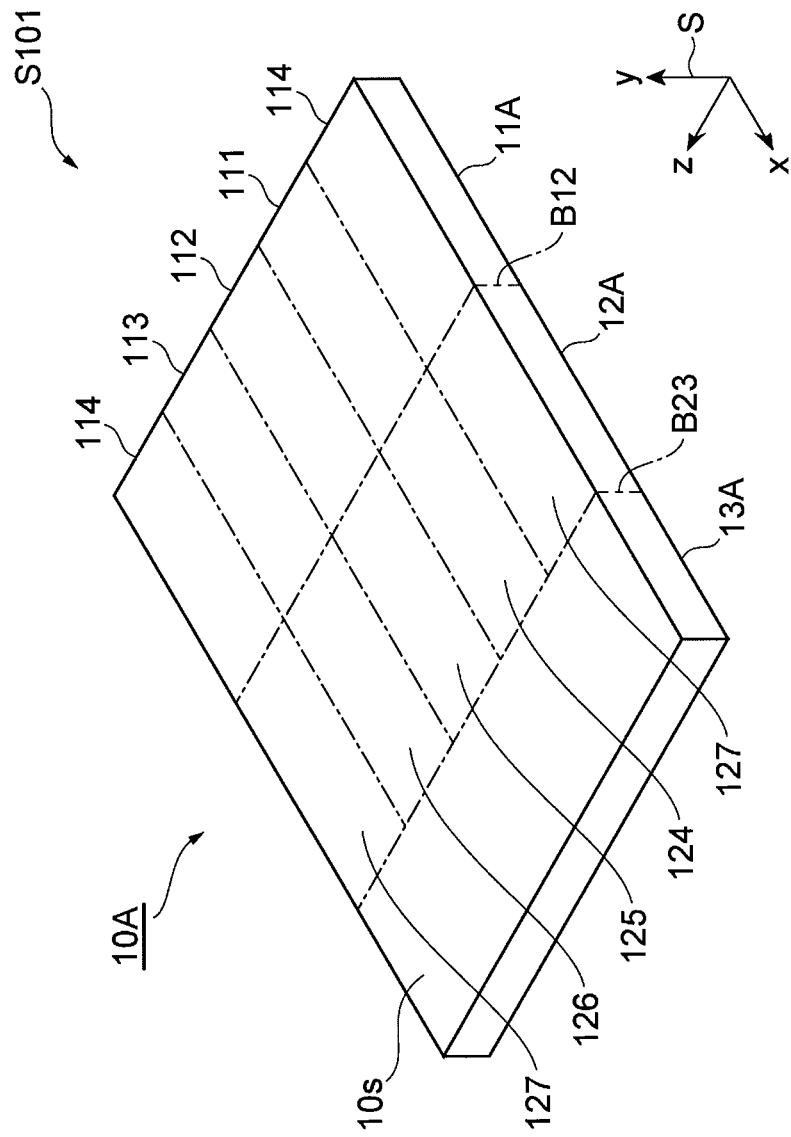
FIG. 4 illustrates the main step of a method for producing the integrated semiconductor device illustrated in FIGS. 2 and 3.

A method for producing the integrated semiconductor device 1 having the foregoing structure will be described in detail below with reference to FIGS. 4 to 20. FIGS. 4 to 20 illustrate the main steps of the method for producing the integrated semiconductor device 1. As illustrated in FIG. 4, in this method, a semiconductor substrate 10A for the semiconductor substrate 10 is prepared (step S101). The semiconductor substrate 10A has a main surface 10s. The semiconductor substrate 10A includes a first portion 11A, a second portion 12A, and a third portion 13A arranged in that order in a predetermined direction (here, in the x-axis direction). The first portion 11A includes the first region 111, the second region 112, and the third region 113 arranged in that order in a direction (here, the z-axis direction) intersecting with the predetermined direction; and fourth regions 114 provided on both sides of the regions 111 to 113 in the z-axis direction.

Figure 5:
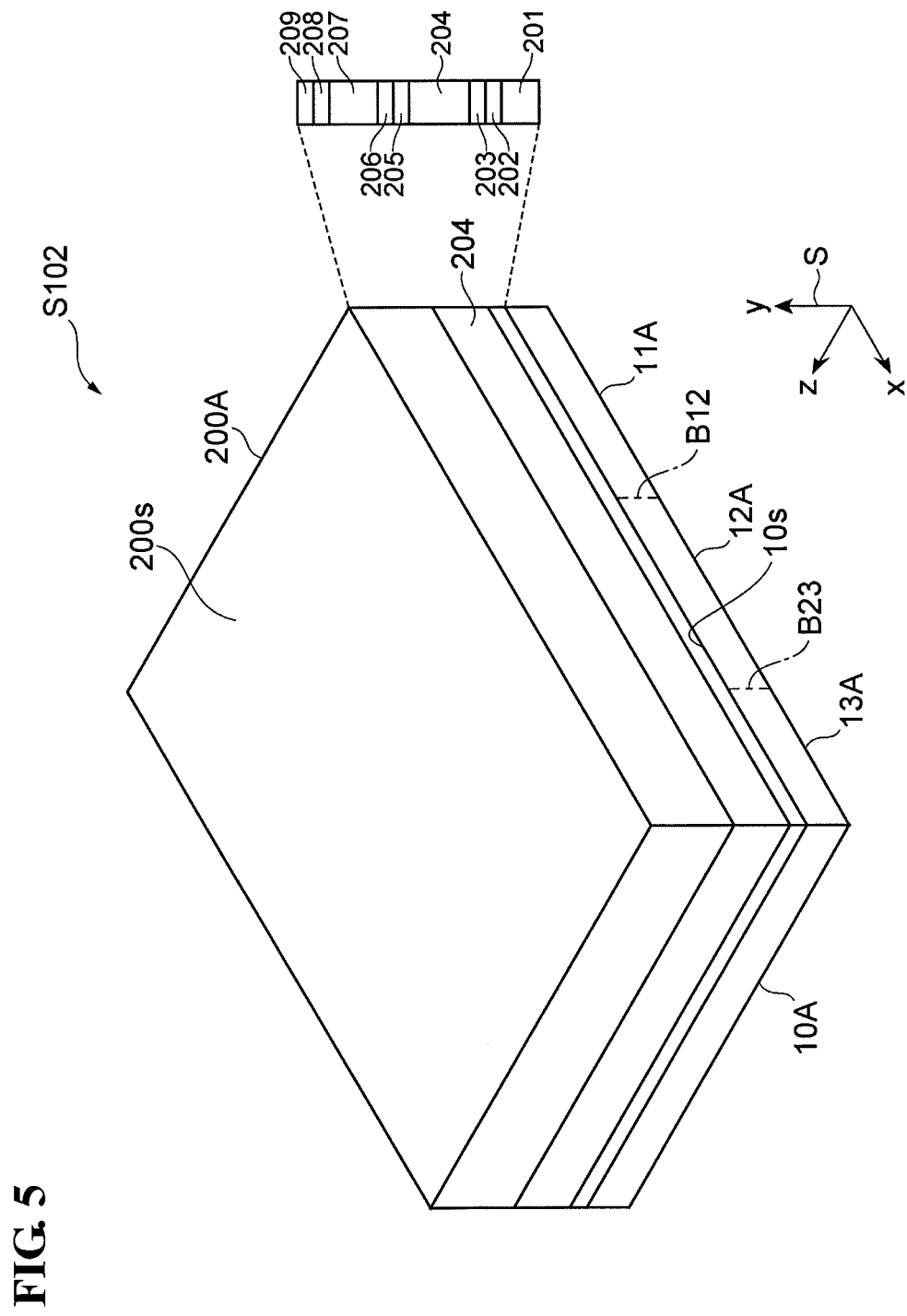
FIG. 5 illustrates the main step of the method for producing the integrated semiconductor device illustrated in FIGS. 2 and 3.

As illustrated in FIG. 5, a stacked semiconductor layer 200A to form the stacked semiconductor structure 200 of the semiconductor laser portion 2 and the waveguide portion 3 is formed on the main surface 10s of the semiconductor substrate 10A (step S102). The stacked semiconductor layer 200A has the same stacked structure as the stacked semiconductor structure 200, except that the cladding layer 210 and the contact layer 211 are not provided. Thus, the stacked semiconductor layer 200A is formed by growing the semiconductor layers 201 to 209 in that order using, for example, a metal-organic vapor phase epitaxy (MOVPE) method on the main surface 10s of the semiconductor substrate 10A. However, the grating layer 202 is formed by the following process: First, a semiconductor layer composed of a III-V group compound semiconductor, such as InGaAsP, is grown on the buffer layer 201 so as to have a thickness of about 80 nm. Next, periodic projections and recesses are formed on the semiconductor layer by, for example, a photolithographic process using interference exposure, thereby forming the grating layer 202.

Figure 6:
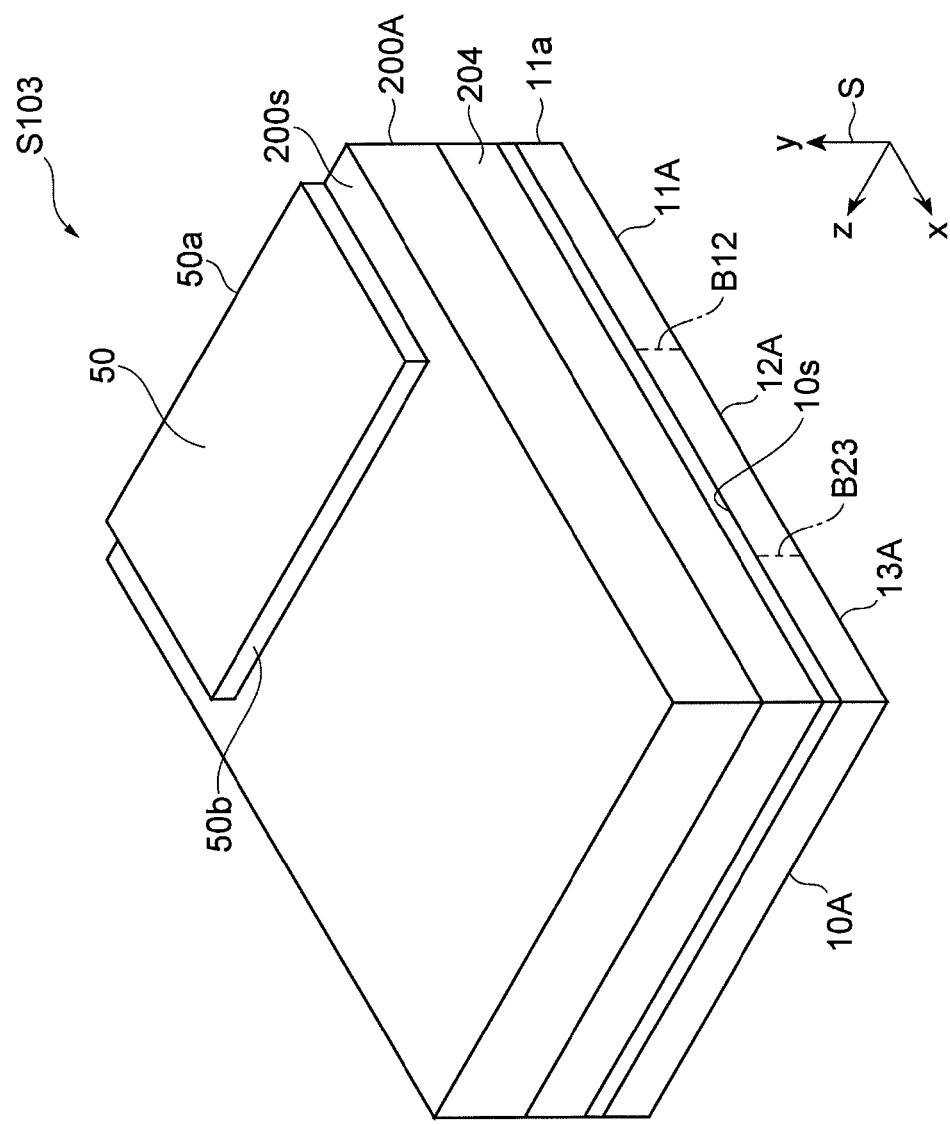
FIG. 6 illustrates the main step of the method for producing the integrated semiconductor device illustrated in FIGS. 2 and 3.
Figure 7:
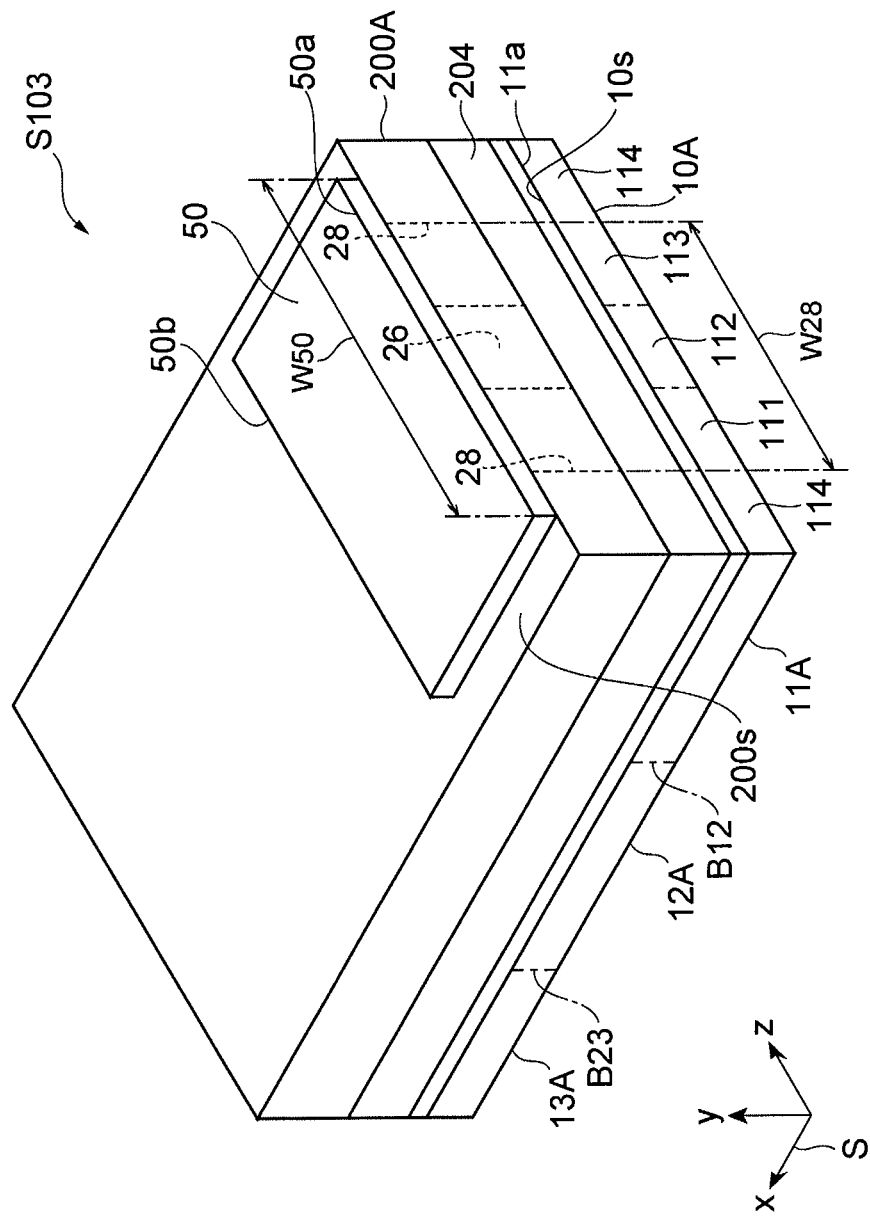
FIG. 7 illustrates the main step of the method for producing the integrated semiconductor device illustrated in FIGS. 2 and 3.

As illustrated in FIGS. 6 and 7, a mask 50 is formed on part of the upper surface 200s of the stacked semiconductor layer 200A (step S103). Here, the upper surface 200s of the stacked semiconductor layer 200A is a surface of the capping layer 209. The mask 50 has, for example, a rectangular shape. One edge 50a of the mask 50 in the x-axis direction is located on an edge 11a of the first portion 11A. The other edge 50b of the mask 50 in the x-axis direction is located at a position closer to the third portion 13A than at least the boundary B12 between the first portion 11A and the second portion 12A. The width W50 of the mask 50 in the z-axis direction is greater than the width W28 of a portion to be formed into the groove portions 28 and the ridge portion 26 (that is, a width from the first regions 111 to the third region 113). The mask 50 may be formed of a dielectric film composed of, for example, SiO$_2$ or SiN. The mask 50 may be formed by, for example, a chemical vapor deposition (CVD) method and lithography.

Figure 8:
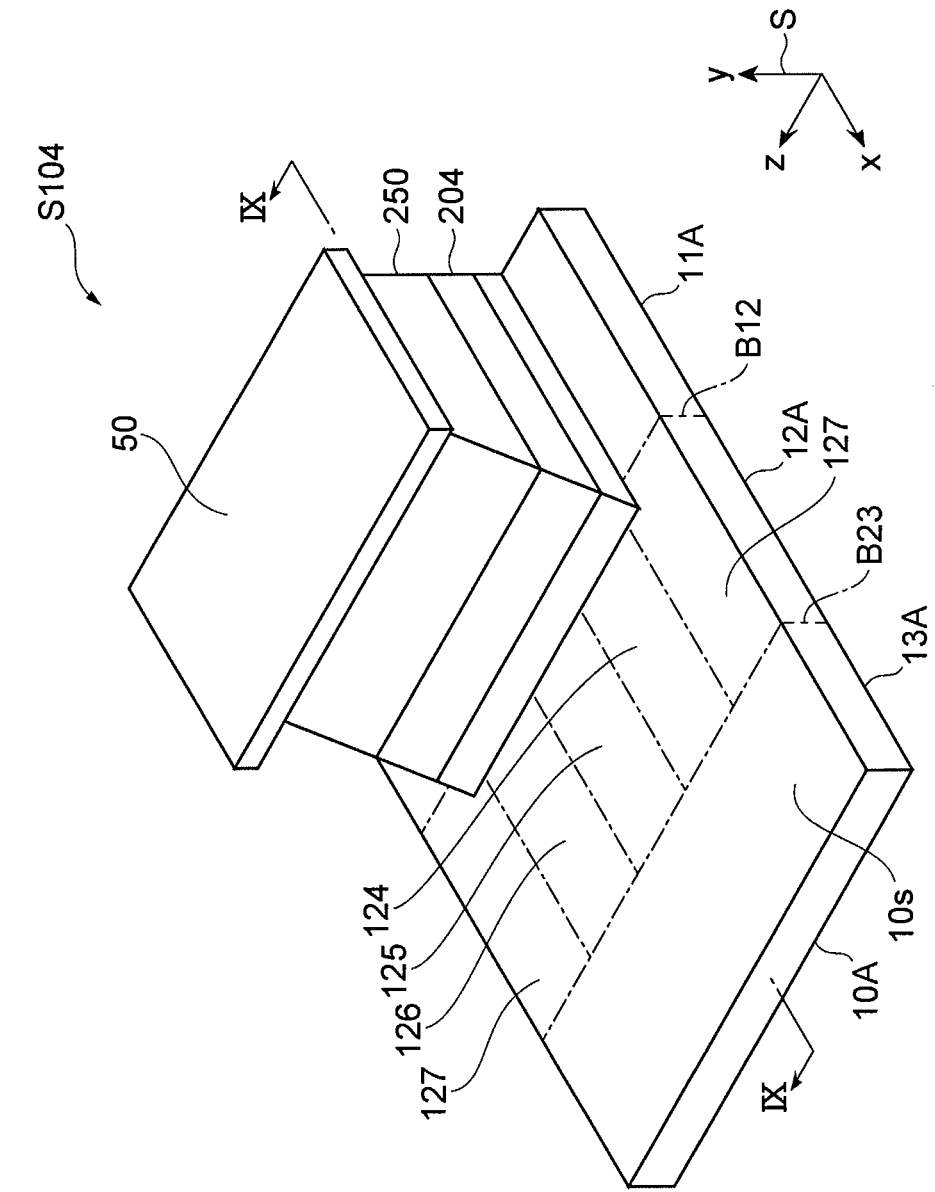
FIG. 8 illustrates the main step of the method for producing the integrated semiconductor device illustrated in FIGS. 2 and 3.
Figure 9:
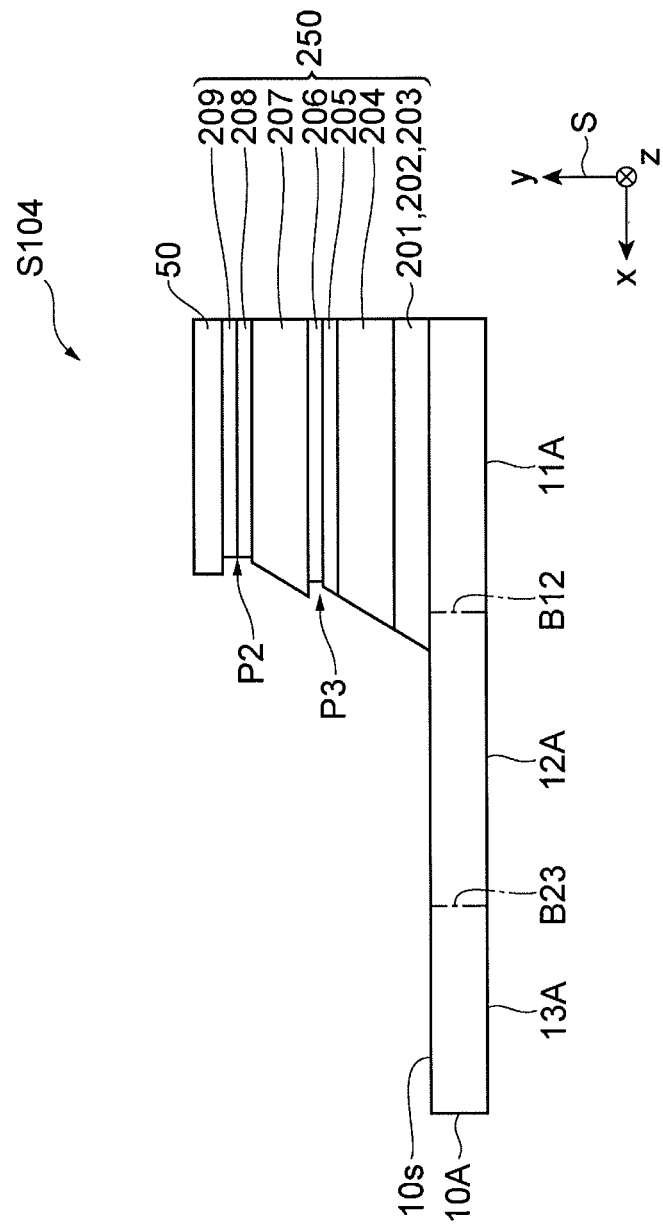
FIG. 9 illustrates the main step of the method for producing the integrated semiconductor device illustrated in FIGS. 2 and 3.

As illustrated in FIG. 8, the stacked semiconductor layer 200A is etched with the mask 50 to form a stacked semiconductor layer 250 (step S104). This etching is performed until the etching reaches the main surface 10s of the semiconductor substrate 10A. An example of the etching will be described in detail below. The capping layer 209 is selectively etched with an etchant in which hydrochloric acid (HCl) and acetic acid (CH$_3$COOH) are mixed together. The side-etched layer 208 is selectively etched with an etchant in which sulfuric acid (H$_2$SO$_4$) and hydrogen peroxide (H$_2$O$_2$) are mixed together. In this case, as illustrated in FIG. 9, the side-etched layer 208 is side-etched in the X-axis direction to form a recessed portion P2. At this time, an overhang of the mask 50 composed of, for example, SiO$_2$ is formed on the recessed portion P2, the overhang extending in the X-axis direction. FIG. 9 is a schematic cross-sectional view taken along line IX-IX in FIG. 10.

Subsequently, the cladding layer 207 is etched with an etchant containing hydrogen bromide (HBr), thereby exposing, for example, the InP(111) surface. The etch-stop layer 206 is selectively etched with an etchant in which sulfuric acid ($H_2SO_4$) and hydrogen peroxide ($H_2O_2$) are mixed together. Also in this case, the etch-stop layer 206 is side-etched in the x-axis direction to form a recessed portion P3. At this time, an overhang of the cladding layer 207 composed of, for example, InP is formed on the recessed portion P3, the overhang extending in the x-axis direction. Then a step of etching the cladding layer 205 with an etchant containing hydrogen bromide, a step of etching the active layer 204 with an etchant in which hydrochloric acid and hydrogen peroxide are mixed together, a step of etching the spacer layer 203 with an etchant containing hydrogen bromide, and a step of etching the grating layer 202 with an etchant in which hydrochloric acid and hydrogen peroxide are mixed together are performed in that order.

Figure 10:
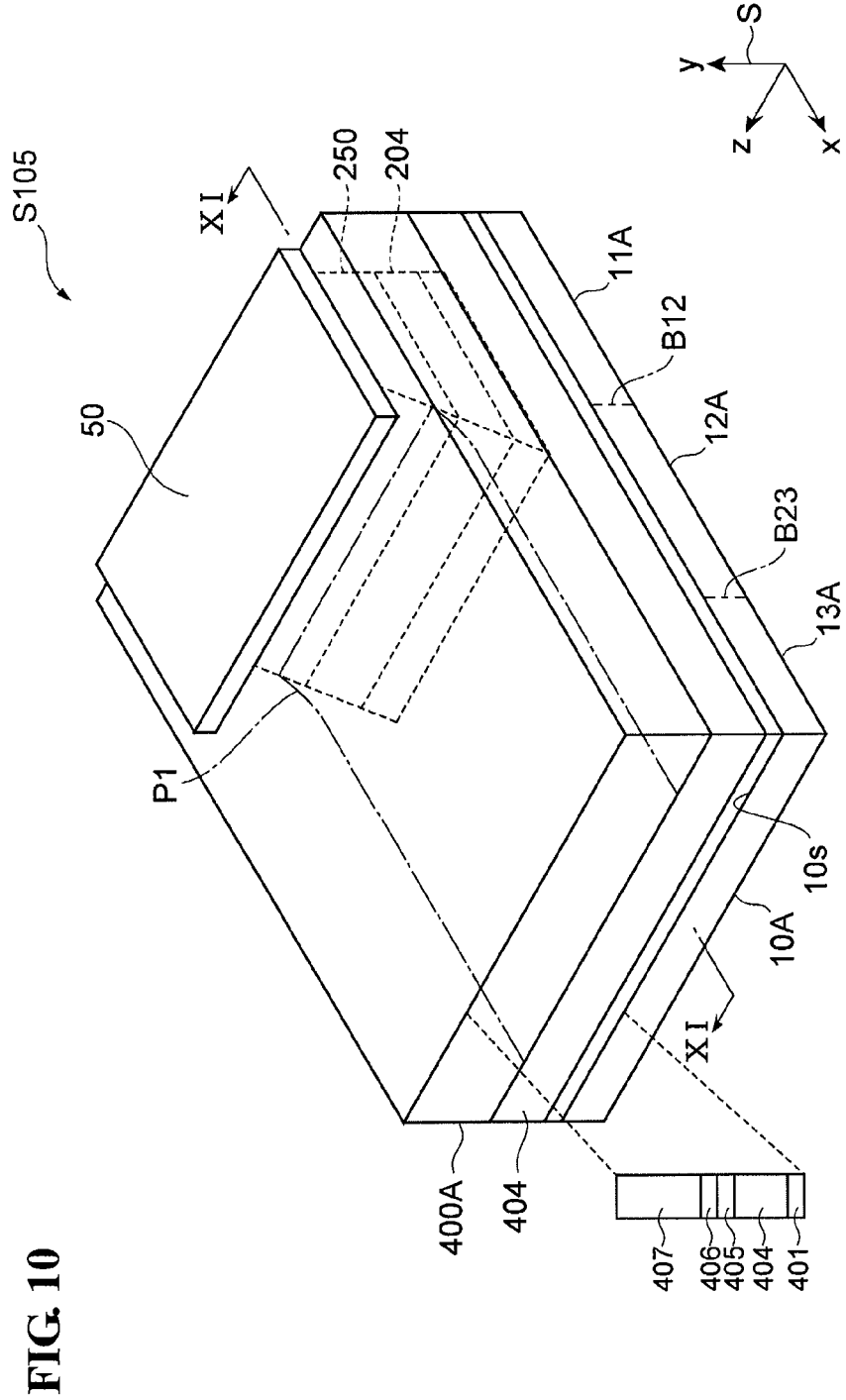
FIG. 10 illustrates the main step of the method for producing the integrated semiconductor device illustrated in FIGS. 2 and 3.
Figure 11:
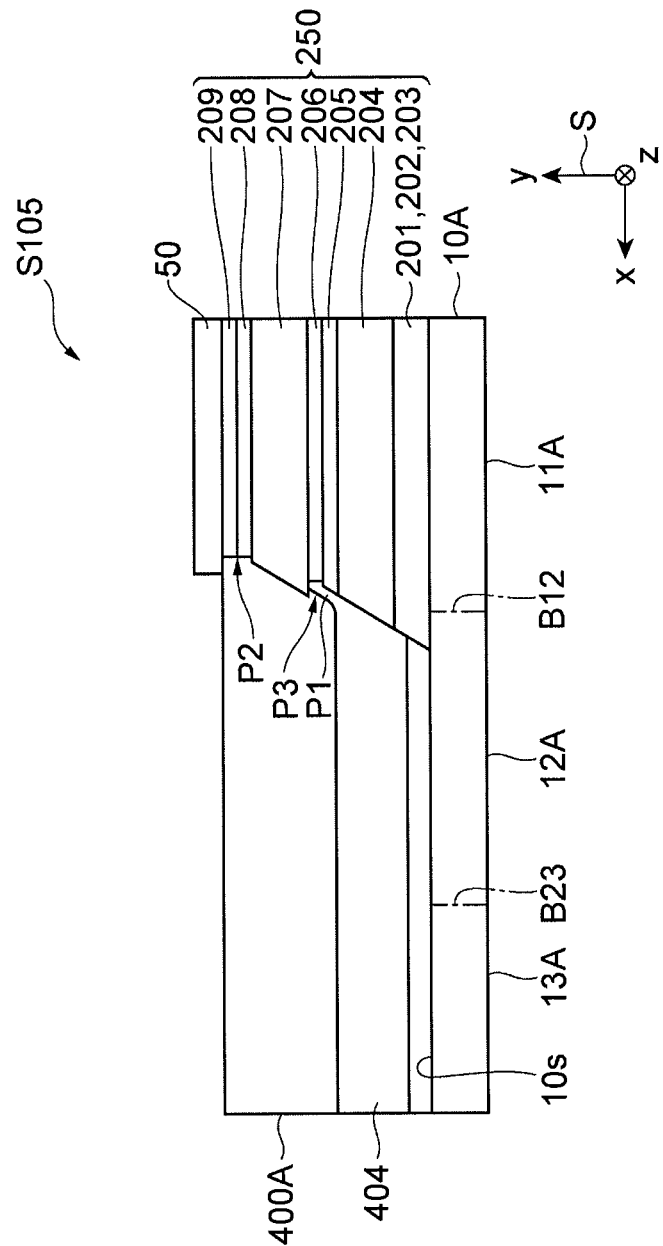
FIG. 11 illustrates the main step of the method for producing the integrated semiconductor device illustrated in FIGS. 2 and 3.

In the subsequent step, as illustrated in FIGS. 10 and 11, a stacked semiconductor layer 400A to form the stacked semiconductor structure 400 is formed on the main surface 10s of the semiconductor substrate 10A exposed in step S104 (step S105). The stacked semiconductor layer 400A has the same stacked structure as the stacked semiconductor structure 400, except that the cladding layer 406 and the contact layer 407 are not provided. Thus, the stacked semiconductor layer 400A is formed by regrowing the semiconductor layers 401, 404, and 405 in that order on the main surface 10s of the semiconductor substrate 10A using, for example, a metal-organic vapor phase epitaxy method with the mask 50 serving as a selective growth mask. FIG. 11 is a schematic cross-sectional view taken along line XI-XI in FIG. 10.

In step S105, the semiconductor layers in the stacked semiconductor layer 400A are joined to the semiconductor layers in the stacked semiconductor layer 250. In particular, the core layer 404 in the stacked semiconductor layer 400A is joined to the active layer 204 in the stacked semiconductor layer 250 by a butt-joint method. Thus, the abnormally grown portion P1 may be formed at the butt-jointed portion. The abnormally grown portion P1 is formed along the recessed portion P3. However, the further growth of the abnormally grown portion P1 is restricted by the overhang of the cladding layer 207 on the recessed portion P3. In step S105, the regrowth thickness of the cladding layer 405 is adjusted in such a manner that the upper surface of the cladding layer 405 is substantially flush with the upper surface of the capping layer 209 in the stacked semiconductor layer 250. The regrowth thickness of the cladding layer 405 is defined by, for example, the recessed portion P2 and the overhang of the mask 50 on the recessed portion P2.

Figure 12:
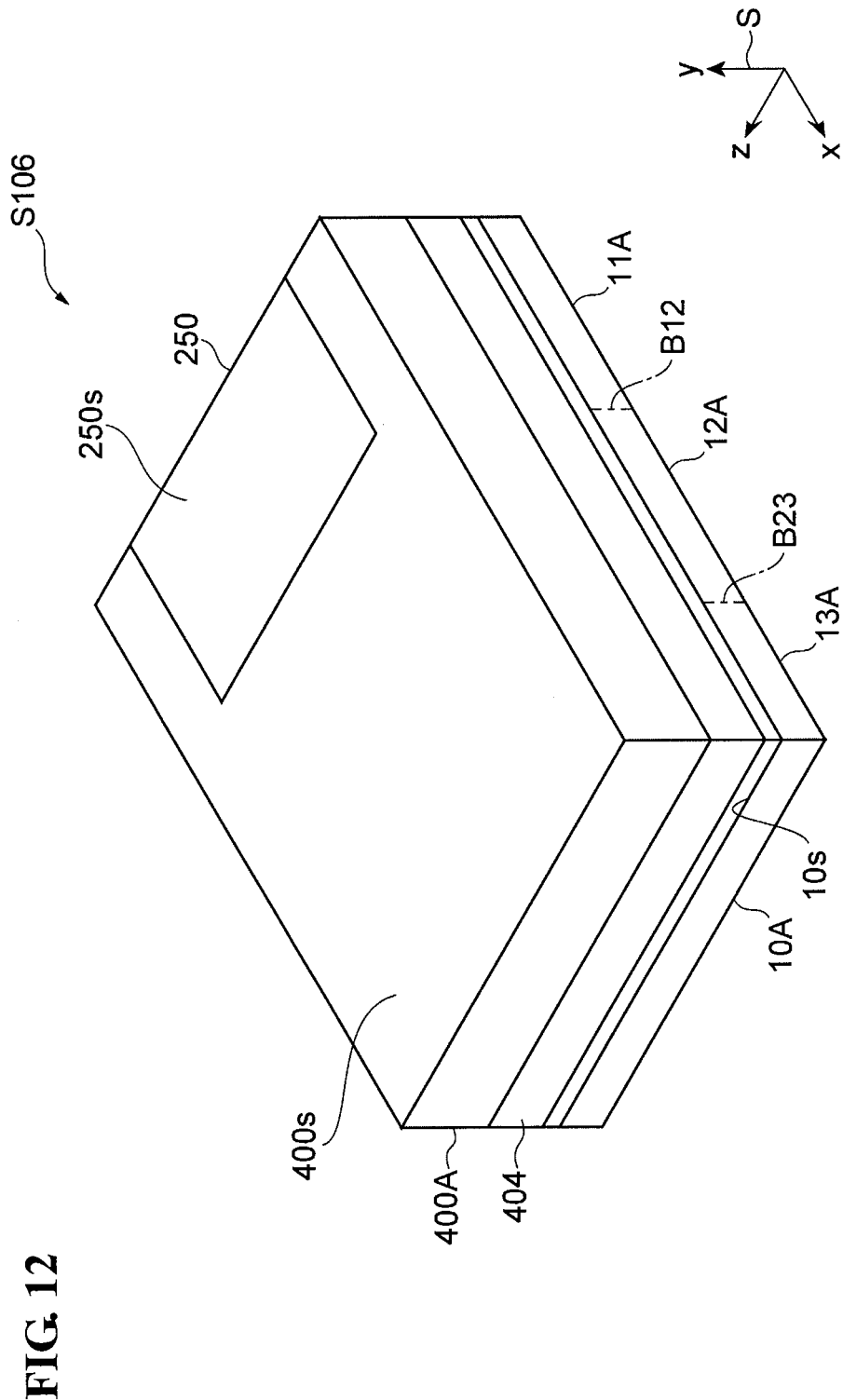
FIG. 12 illustrates the main step of the method for producing the integrated semiconductor device illustrated in FIGS. 2 and 3.

As illustrated in FIG. 12, the mask 50 is removed with, for example, hydrofluoric acid (step S106). In step S106, the mask 50 is removed to expose the upper surface 250s of the stacked semiconductor layer 250 and the upper surface 400s of the stacked semiconductor layer 400A. The upper surface 250s of the stacked semiconductor layer 250 is a surface of the capping layer 209. The upper surface 400s of the stacked semiconductor layer 400A is a surface of the cladding layer 405.

Figure 13:
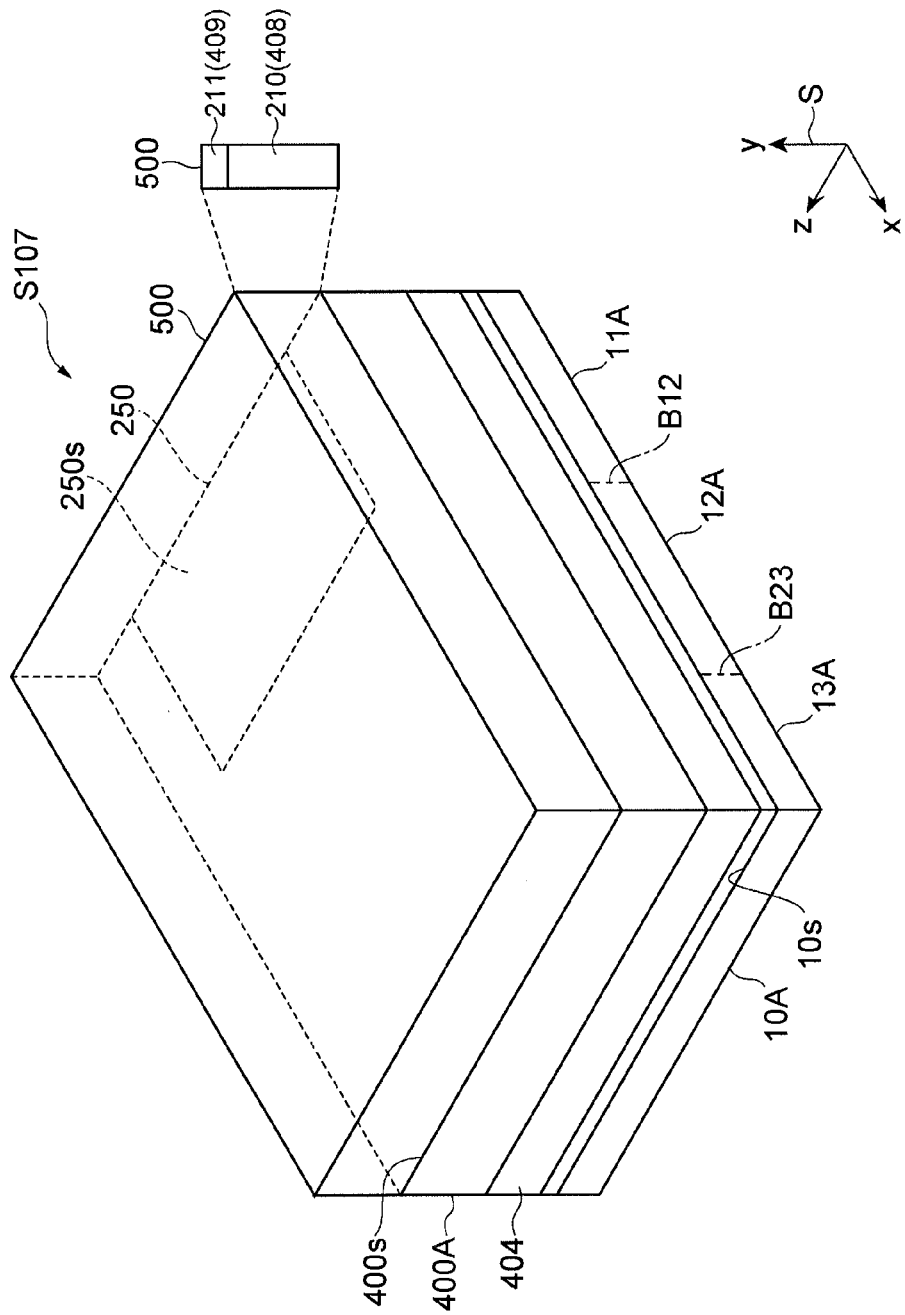
FIG. 13 illustrates the main step of the method for producing the integrated semiconductor device illustrated in FIGS. 2 and 3.

As illustrated in FIG. 13, a stacked semiconductor layer 500 is formed on the upper surface 250s of the stacked semiconductor layer 250 and the upper surface 400s of the stacked semiconductor layer 400A (step S107). The stacked semiconductor layer 500 includes the cladding layer 210 and contact layer 211 of the stacked semiconductor structure 200 (or the cladding layer 406 and the contact layer 407 of the stacked semiconductor structure 400). Thus, the stacked semiconductor layer 500 is formed by growing the semiconductor layers 210 and 211 (406 and 407) in that order by, for example, a metal-organic vapor phase epitaxy (MOVPE) method on the upper surface 250s of the stacked semiconductor layer 250 and the upper surface 400s of the stacked semiconductor layer 400A.

Figure 14:
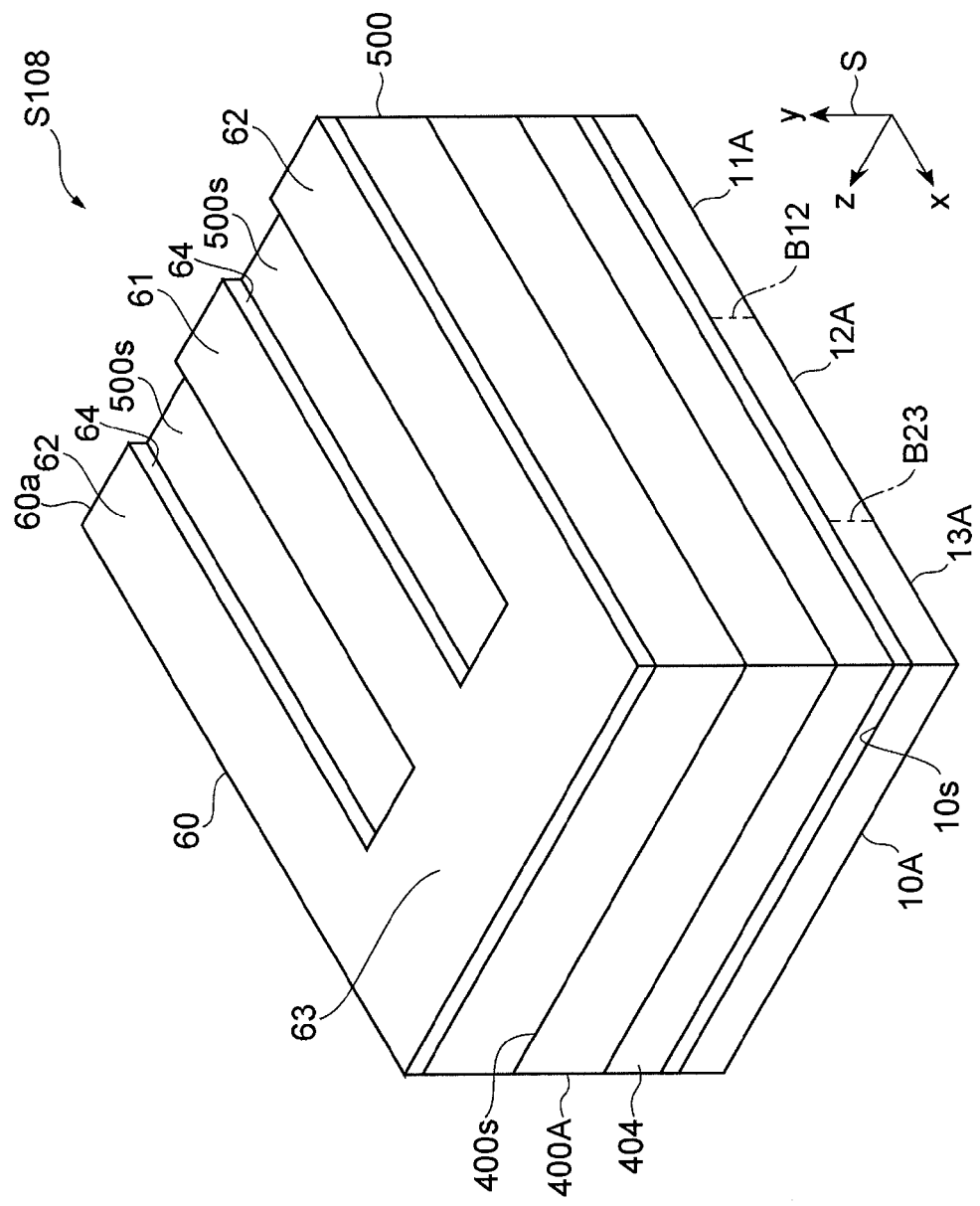
FIG. 14 illustrates the main step of the method for producing the integrated semiconductor device illustrated in FIGS. 2 and 3.
Figure 15A:
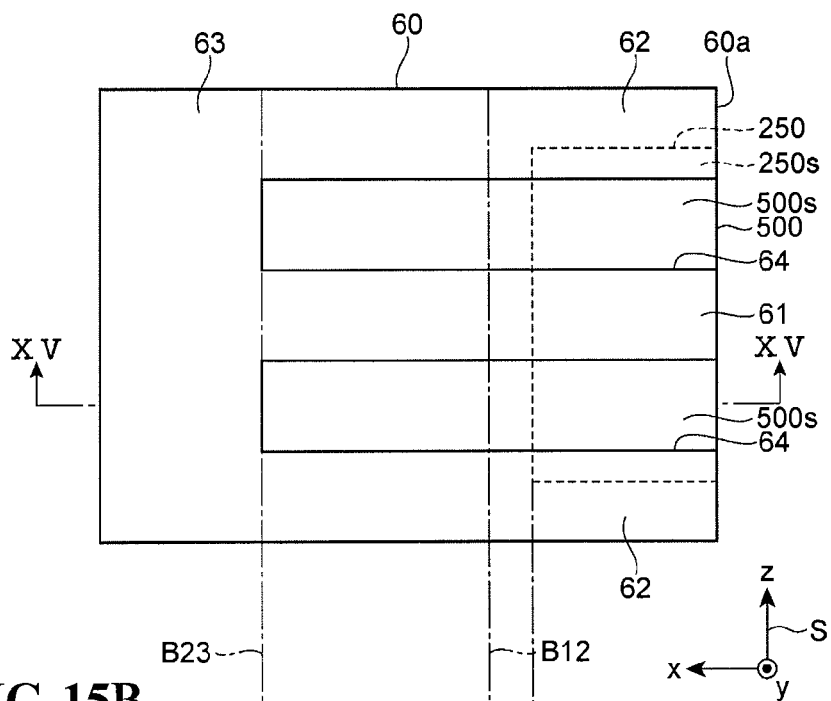
FIGS. 15A and 15B illustrate the main step of the method for producing the integrated semiconductor device illustrated in FIGS. 2 and 3.
Figure 15B:
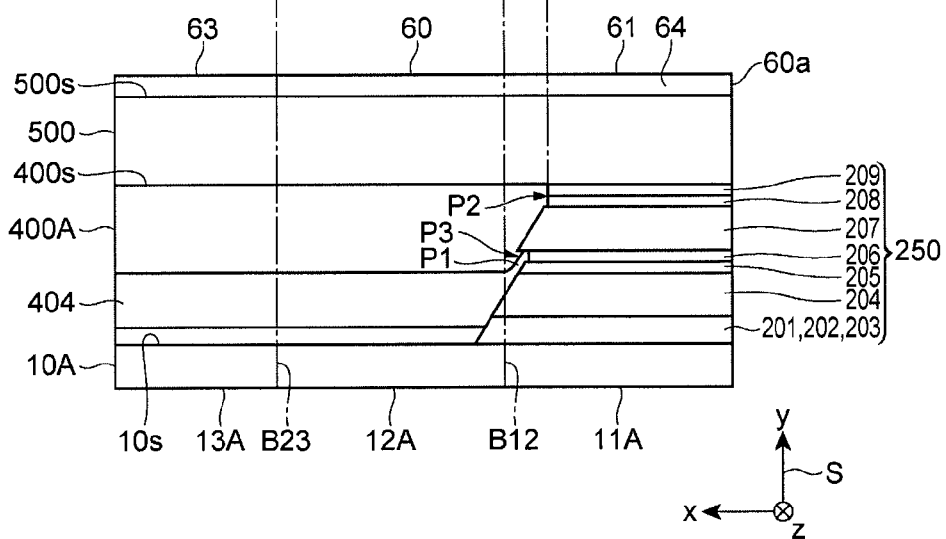

As illustrated in FIGS. 14, 15A, and 15B, a mask 60 is formed on the upper surface 500s of the stacked semiconductor layer 500 (step S108). The upper surface 500s of the stacked semiconductor layer 500 is a surface of the contact layer 211 (or the contact layer 407). The mask 60 may be formed of a dielectric film composed of, for example, $SiO_2$ or SiN. The mask 60 may be formed by, for example, a chemical vapor deposition method and lithography. FIG. 15A is a plan view when viewed in the y-axis direction in FIG. 14. FIG. 15B is a schematic cross-sectional view taken along line XV-XV in FIG. 15A.

The mask 60 includes a first portion 61, a pair of second portions 62, and a third portion 63. The first portion 61 has a stripe shape extending in the x-axis direction. The first portion 61 is arranged above the second region 112 of the first portion 11A of the semiconductor substrate 10A and defines the ridge portion 26. Each of the second portions 62 has a stripe shape extending in the x-axis direction. Each of the second portions 62 is arranged above a corresponding one of the fourth regions 114 of the first portion 11A of the semiconductor substrate 10A and defines a corresponding one of the pair of terrace portions 29. The third portion 63 has a rectangular shape. The third portion 63 is arranged above the second portion 12A and the third portion 13A of the semiconductor substrate 10A. The third portion 63 connects the first portion 61 to the second portions 62.

The mask 60 has a pair of openings 64. The openings 64 are located above the first region 111 and the third region 113 of the first portion 11A of the semiconductor substrate 10A. Each of the openings 64 has a stripe shape extending in the x-axis direction. Each of the openings 64 defines a corresponding one of the pair of groove portions 28. Each of the openings 64 extends from one edge 60a of the mask 60 in the x-axis direction to a position located above the boundary B12 between the first portion 11A and the second portion 12A. That is, each of the openings 64 does not reach the boundary B23, where the butt-jointed portion is located, between the second portion 12A and the third portion 13A. Thus, the upper surface 500s of the stacked semiconductor layer 500 is not covered with the mask 60 and is exposed above the first region 111 and the third region 113 of the first portion 11A of the semiconductor substrate 10A. The upper surface 500s of the stacked semiconductor layer 500 is covered with the mask 60 above the boundary B23 where the butt-jointed portion is located.

Figure 16:
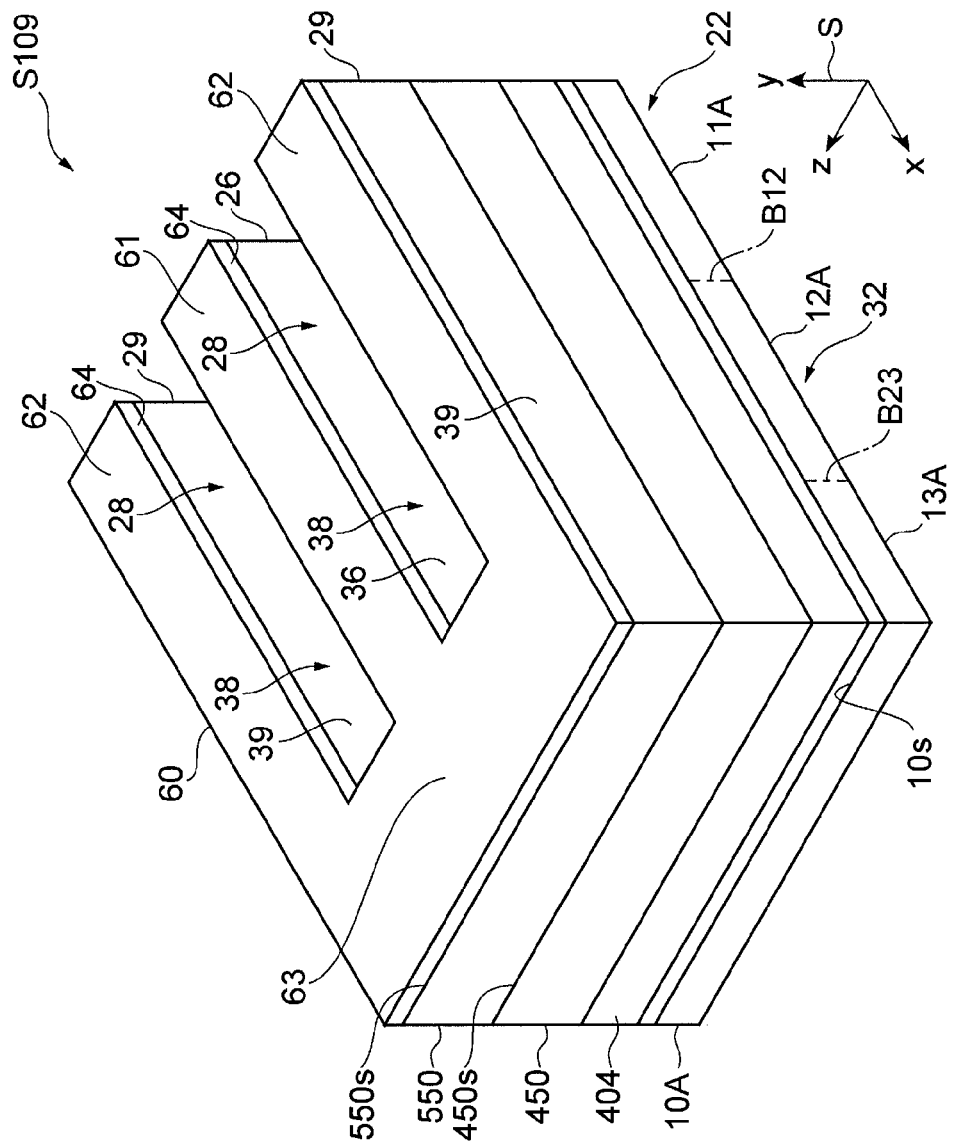
FIG. 16 illustrates the main step of the method for producing the integrated semiconductor device illustrated in FIGS. 2 and 3.
Figure 17:
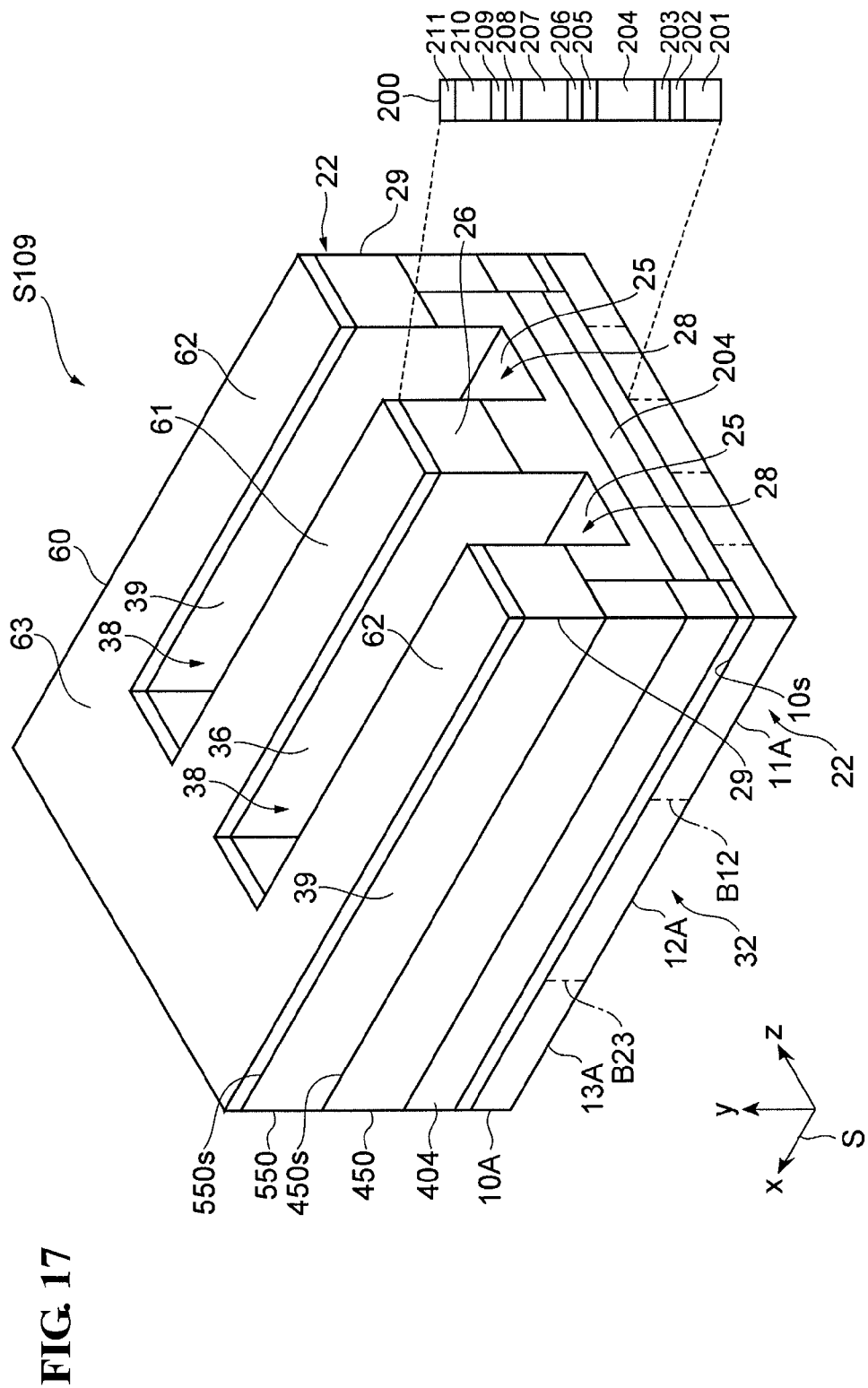
FIG. 17 illustrates the main step of the method for producing the integrated semiconductor device illustrated in FIGS. 2 and 3.

As illustrated in FIGS. 16 and 17, the stacked semiconductor layer 500 and the stacked semiconductor layer 250 are etched with the mask 60 (step S109). This results in the formation of the base portion 25, the ridge portion 26, the groove portions 28, and the terrace portions 29 above the first portion 11A of the semiconductor substrate 10A. That is, the first waveguide 22 is formed. A stacked semiconductor layer 550 is formed above the second portion 12A and the third portion 13A of the semiconductor substrate 10A. This etching is selectively performed until the etching reaches the etch-stop layer 206 in the stacked semiconductor layer 250. That is, in this etching, the active layer 204 is not etched. The base portion 25 includes a portion of the stacked semiconductor structure 200 lower than the etch-stop layer 206. The ridge portion 26 includes a portion of the stacked semiconductor structure 200 higher than the etch-stop layer 206.

Figure 18:
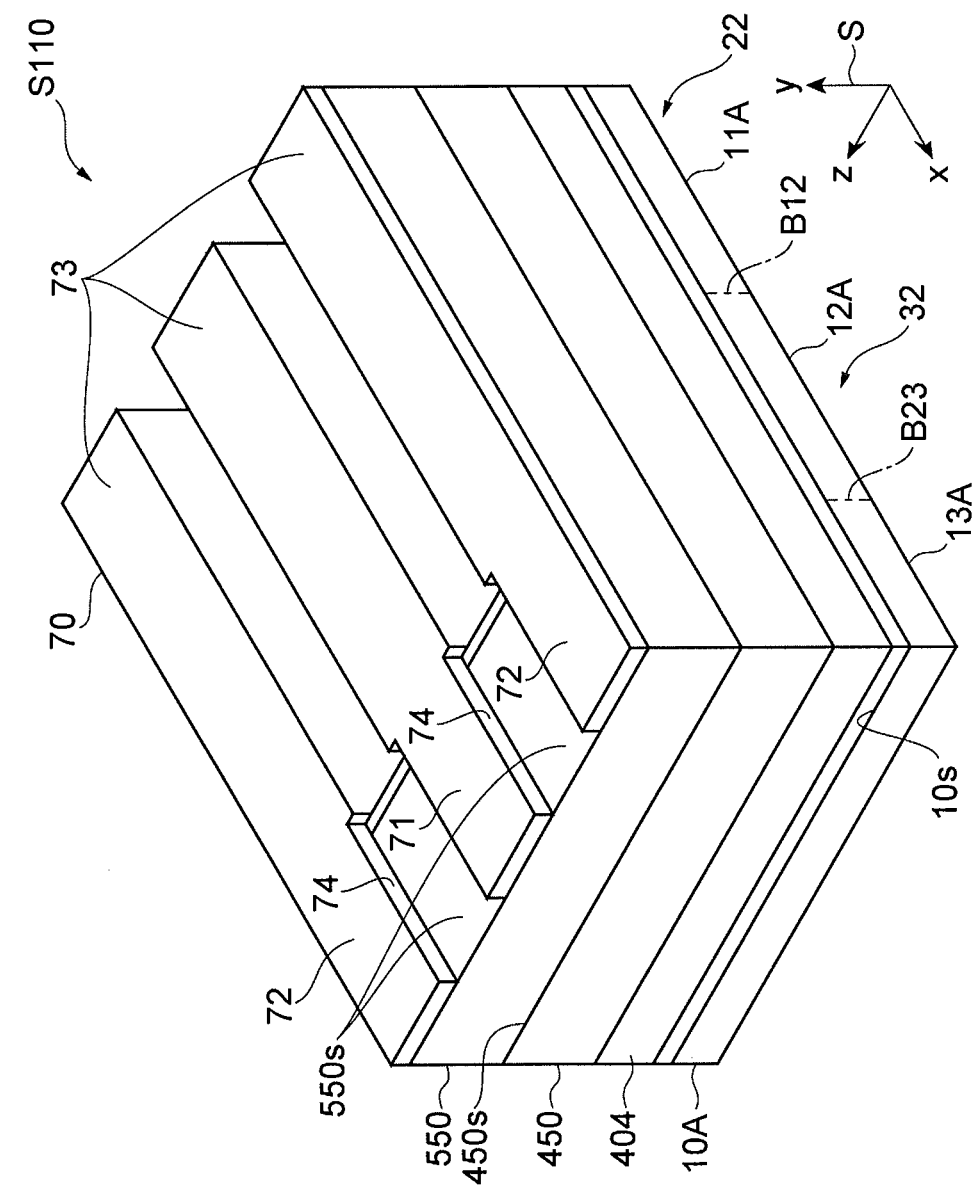
FIG. 18 illustrates the main step of the method for producing the integrated semiconductor device illustrated in FIGS. 2 and 3.
Figure 19:
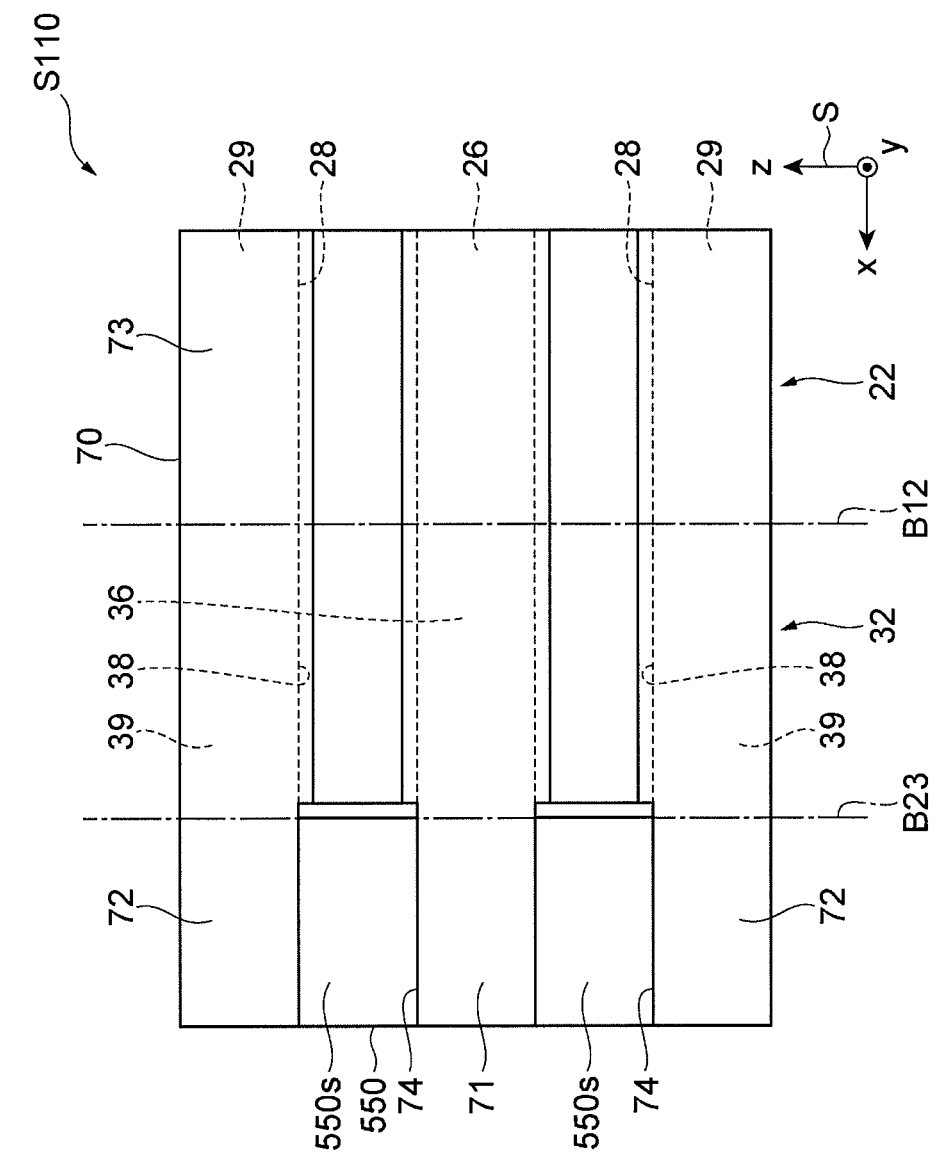
FIG. 19 illustrates the main step of the method for producing the integrated semiconductor device illustrated in FIGS. 2 and 3.

As illustrated in FIGS. 18 and 19, a mask 70 is formed on, for example, the upper surface 550s of the stacked semiconductor layer 550 (step S110). Specifically, in step S110, the mask 70 is formed on the upper surface 550s of the stacked semiconductor layer 550, the upper surface of the ridge portion 26, inner surfaces of the groove portions 28, and upper surfaces of the terrace portions 29. The upper surface 550s of the stacked semiconductor layer 550 is a surface of the contact layer 211 (or the contact layer 407). The mask 70 may be formed of a dielectric film composed of, for example, $SiO_2$ or SiN. The mask 70 may be formed by, for example, a chemical vapor deposition method and lithography.

The mask 70 includes a first portion 71, a pair of second portions 72, and a third portion 73. The first portion 71 has a stripe shape extending in the x-axis direction. The first portion 71 is arranged above portions of the second portion 12A and the third portion 13A of the semiconductor substrate 10A corresponding to the second region 112. The first portion 71 defines the stripe-shaped mesa 30 and the stripe-shaped mesa 40. Each of the second portions 72 has a stripe shape extending in the x-axis direction. The second portions 72 are arranged above portions of the second portion 12A and the third portion 13A of the semiconductor substrate 10A corresponding to the fourth regions 114. The second portions 72 define the terrace portions 39 and the terrace portions 49. The third portion 73 is arranged above the first portion 11A of the semiconductor substrate 10A and connects the first portion 71 to the second portions 72.

The mask 70 has a pair of openings 74. The openings 74 are arranged above portions of the second portion 12A and the third portion 13A of the semiconductor substrate 10A corresponding to the first region 111 and the third region 113. Each of the openings 74 has a stripe shape extending in the x-axis direction. The openings 74 define the pair of groove portions 38 and the pair of groove portions 48. Each of the openings 74 extends from a portion above the third portion 13A of the semiconductor substrate 10A to a portion above the boundary B12 between the second portion 12A and the first portion 11A through a portion above the boundary B23 between the third portion 13A and the second portion 12A.

Figure 20:
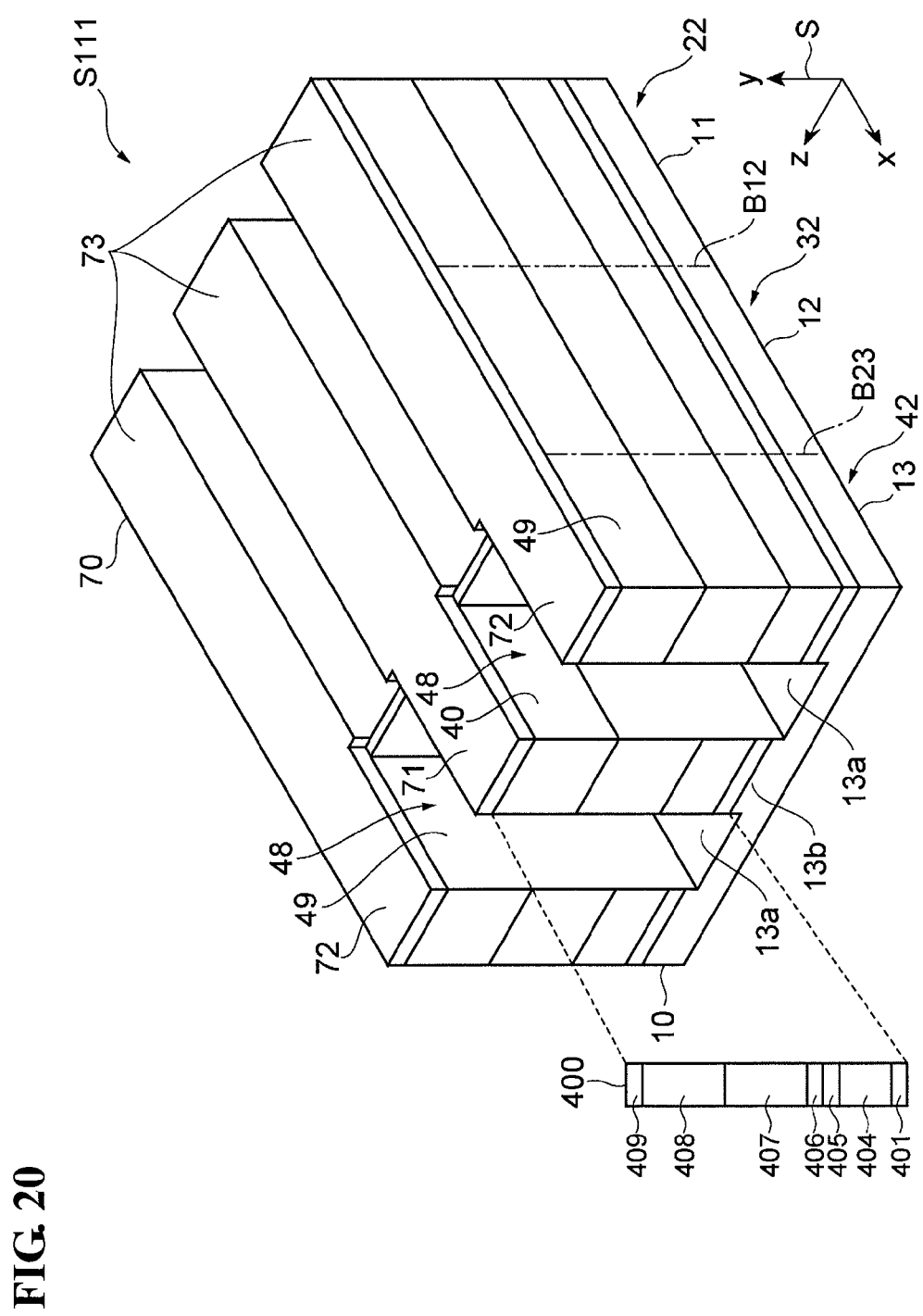
FIG. 20 illustrates the main step of the method for producing the integrated semiconductor device illustrated in FIGS. 2 and 3.

As illustrated in FIG. 20, the stacked semiconductor layers 550 and 400A are etched with the mask 70 (step S111). This etching results in the formation of the stripe-shaped mesa 30, the groove portions 38, the terrace portions 39, the stripe-shaped mesa 40, the groove portions 48, and the terrace portions 49 from the stacked semiconductor layers 550 and 400A. That is, the second waveguide 32 and the third waveguide 42 are formed. Furthermore, the semiconductor substrate 10A is partially etched to form the semiconductor substrate 10 including the recessed portions 12a and 13a and the protruding portions 12b and 13b. After removal of the mask 70, the passivation film, the resin portion, and the electrode are formed, thereby providing the integrated semiconductor device 1 having the structure illustrated in FIGS. 2 and 3.

As described above, the integrated semiconductor device 1 includes the semiconductor laser portion 2 and the optical modulator portion 4. The semiconductor laser portion 2 includes the first waveguide 22 having the base portion 25 and the ridge portion 26 provided on the base portion 25. The base portion 25 includes the active layer 204. In the integrated semiconductor device 1, the ridge waveguide is used as the first waveguide 22. Thus, in the semiconductor laser portion 2, a light-emitting region of the active layer 204 defined by the width W26 of the ridge portion 26 is not exposed at a side surface of the active layer 204 (a side surface of the base portion 25). In the integrated semiconductor device 1, it is thus possible to inhibit the degradation of the light-emitting region due to the exposure of the active layer. Hence, it is possible to ensure the semiconductor laser portion 2 having satisfactory properties and high reliability.

In the integrated semiconductor device 1, the optical modulator portion 4 includes the third waveguide 42 having the stripe-shaped mesa 40 containing the core layer 404. In the integrated semiconductor device 1, the high-mesa waveguide is used as the third waveguide 42. It is thus possible to accurately adjust the width of the optical waveguide including the core layer 404 by controlling the mesa width W40 of the stripe-shaped mesa 40 in such a manner that the optical waveguide is a single-mode optical waveguide. This allows only a single mode to be guided into the optical waveguide. In the integrated semiconductor device 1, it is thus possible to ensure properties of the optical modulator portion 4.

In the integrated semiconductor device 1, the second waveguide 32 of the waveguide portion 3 is provided between the first waveguide 22 of the semiconductor laser portion 2 and the third waveguide 42 of the optical modulator portion 4. The second waveguide 32 has the stripe-shaped mesa 30 including the core layer 304. That is, in the integrated semiconductor device 1, the high-mesa waveguide is used as the second waveguide 32. Furthermore, the core layer 304 of the waveguide portion 3 and the active layer 204 of the semiconductor laser portion 2 are integrally formed. Moreover, the core layer 404 of the optical modulator portion 4 is joined to the core layer 304 of the waveguide portion 3 by the butt-joint method.

That is, in the integrated semiconductor device 1, the butt-jointed portion is provided not on the side of the ridge waveguide but on the side of the high-mesa waveguide. Thus, in the integrated semiconductor device 1, the butt-jointed portion is located at a position relatively remote from the semiconductor laser portion 2. Even when the abnormally grown portion P1 is formed at the butt-jointed portion, the injected current into the second waveguide 32 is less likely to flow into the abnormally grown portion P1. Crystal defects are easily introduced in the vicinity of the abnormally grown portion P1. Therefore, the injection of a current into the abnormally grown portion P1 may cause an increase in a leakage current flowing to portions other than the active layer and a further increase in crystal defects. In the integrated semiconductor device 1, it is possible to inhibit the degradations of device properties and reliability due to a current flowing into the abnormally grown portion P1.

In the integrated semiconductor device 1, as described above, the butt-jointed portion is provided not on the side of the ridge waveguide but on the side of the high-mesa waveguide. Thus, even when the abnormally grown portion P1 is formed at the butt-jointed portion, the abnormally grown portion P1 does not inhibit the dimensional control of the base portion 25 and the ridge portion 26. Hence, in the integrated semiconductor device 1, it is possible to surely control the dimensions of the base portion 25 and the ridge portion 26 to ensure more suitable properties of the semiconductor laser portion 2.

While the integrated semiconductor device according to the foregoing embodiment of the present invention has been described, an integrated semiconductor device according to the present invention is not limited to the foregoing integrated semiconductor device 1. The integrated semiconductor device according to the present invention may be any modification of the integrated semiconductor device 1 without departing from the gist of claims.

Figure 21A:
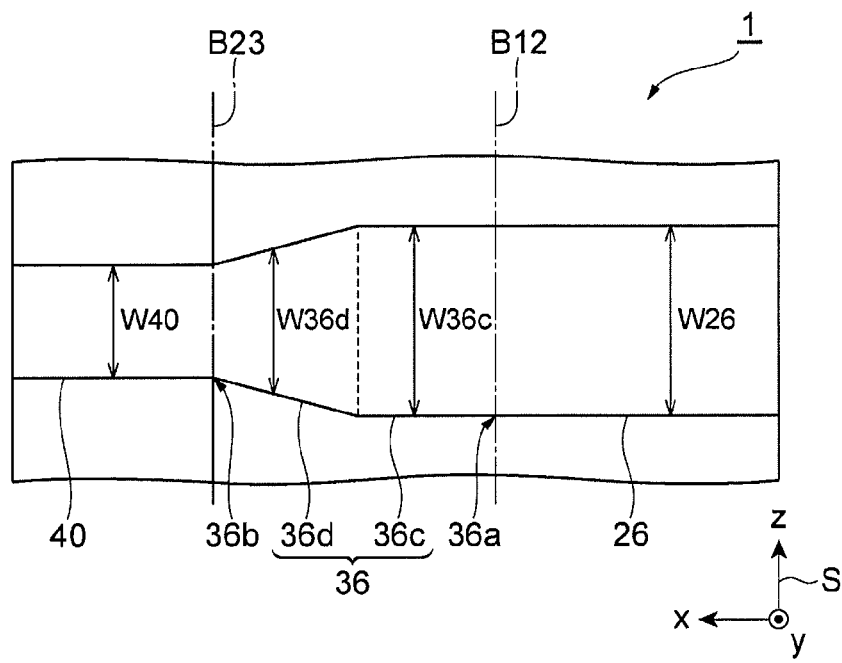
FIGS. 21A and 21B illustrate plan views illustrating modifications of the integrated semiconductor device illustrated in FIGS. 2 and 3.

For example, the integrated semiconductor device 1 may be a device according to an embodiment illustrated in FIG. 21A. As illustrated in FIG. 21A, in the integrated semiconductor device 1, the width W26 of the ridge portion 26 is held substantially constant at a first width in the x-axis direction. The mesa width W40 of the stripe-shaped mesa 40 is held substantially constant at a second width, which is smaller than the first width, in the x-axis direction. Meanwhile, the stripe-shaped mesa 30 includes a region whose mesa width is changed. That is, the stripe-shaped mesa 30 includes a first mesa region 30c containing the one end 30a; and a second mesa region 30d containing the other end 30b.

The mesa width W30c of the first mesa region 30c is gradually reduced from the first width to the second width in the x-axis direction. The mesa width W30d of the second mesa region 30d is held substantially constant at the second width in the x-axis direction. In the integrated semiconductor device 1 having the foregoing structure, the first mesa region 30c functions as a mode matching section. In the integrated semiconductor device 1, it is thus possible to suppress the mismatch between the modes propagating in the semiconductor laser portion 2 and the optical modulator portion 4.

Figure 21B:
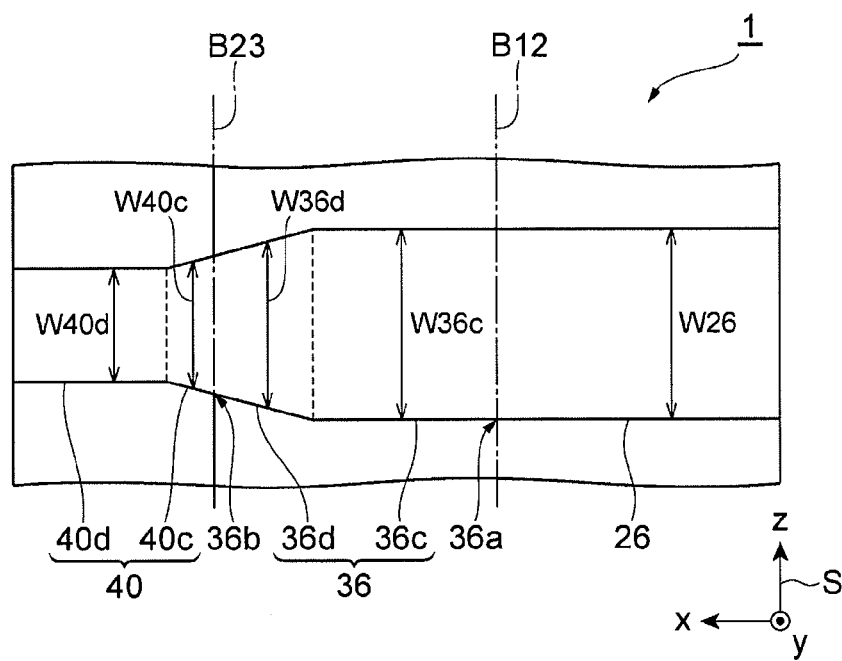

Alternatively, the integrated semiconductor device 1 may be a device according to an embodiment illustrated in FIG. 21B. In the integrated semiconductor device 1, as illustrated in FIG. 21B, the ridge portion 26 includes a first ridge region 26c and a second ridge region 26d extending from the first ridge region 26c to the one end 30a of the stripe-shaped mesa 30. The width W26c of the first ridge region 26c is held substantially constant at the first width in the x-axis direction. The width W26d of the second ridge region 26d is gradually reduced from the first width to the second width in the x-axis direction. The stripe-shaped mesa 30 includes the first mesa region 30c containing the one end 30a; and the second mesa region 30d containing the other end 30b.

The mesa width W30c of the first mesa region 30c is gradually reduced from the second width to a third width in the x-axis direction. The mesa width W30d of the second mesa region 30d is held substantially constant at the third width in the x-axis direction. The mesa width W40 of the stripe-shaped mesa 40 is held substantially constant at the third width in the x-axis direction. In the integrated semiconductor device 1 having the foregoing structure, the second ridge region 26d and the first mesa region 30c function as a mode matching section. Also in this integrated semiconductor device 1, it is thus possible to suppress the mismatch between the modes propagating in the semiconductor laser portion 2 and the optical modulator portion 4.

What is claimed is:

1. An integrated semiconductor device comprising:
   a substrate including a first portion, a second portion, and a third portion that are arranged in a waveguiding direction;
   a first waveguide provided on the first substrate portion, the first waveguide including a base portion and a ridge portion provided on the base portion, the base portion containing a first core layer, the ridge portion extending in the waveguiding direction;
   a second waveguide provided on the second substrate portion, the second waveguide including a first stripe-shaped mesa on the substrate, the first stripe-shaped mesa containing a second core layer and extending in the waveguiding direction; and
   a third waveguide provided on the third substrate portion, the third waveguide including a second stripe-shaped mesa containing a third core layer and extending in the waveguiding direction, the third core layer being in direct contact with the second core layer at a butt-jointed portion having a location with respect to the substrate that is between the second and the third substrate portions, the third core layer and the second core layer being optically coupled to each other, wherein
   the first stripe-shaped mesa of the second waveguide has an end that is connected to the base portion and the ridge portion of the first waveguide at a location with respect to the substrate that is different from location of the butt-jointed portion,
   the first stripe-shaped mesa is connected to the second strip-shaped mesa at an other end of the first stripe-shaped mesa, and
   the second core layer is integral with the first core layer.

2. The integrated semiconductor device according to claim 1, wherein
   the first portion of the substrate includes a first region, a second region, and a third region arranged in that order in a direction intersecting with the waveguiding direction,
   the base portion and the first core layer are provided on the first region, the second region, and the third region, and
   the ridge portion is provided on the second region.

3. The integrated semiconductor device according to claim 1, wherein the
   first core layer includes an active layer,
   the first waveguide constitutes a light-emitting portion so as to generate light in the active layer,
   the second waveguide constitutes a waveguide portion so as to propagate light from the first waveguide to the third waveguide, and
   the third waveguide constitutes an optical modulator portion so as to modulate light propagated from the first waveguide.

4. The integrated semiconductor device according to claim 1, wherein
   each of the substrate, the first core layer, and the second core layer is composed of a III-V group compound semiconductor, and
   the third core layer is composed of a III-V group compound semiconductor containing Al.

5. The integrated semiconductor device according to claim 1, wherein
   the ridge portion has a width that is substantially constant at a first width in the waveguiding direction,
   the second stripe-shaped mesa has a width that is substantially constant at a second width in the waveguiding direction, the second width being smaller than the first width,
   the first stripe-shaped mesa includes a first mesa region and a second mesa region, the first and second mesa regions containing the one end and the other end of the first stripe-shaped mesa, respectively,
   the first mesa region has a width that is reduced from the first width to the second width in the waveguiding direction, and
   the second mesa region has a width that is substantially constant at the second width in the waveguiding direction.

6. The integrated semiconductor device according to claim 1, wherein
   the ridge portion includes a first ridge region, and a second ridge region extending from the first ridge region to the one end of the first stripe-shaped mesa,
   the first ridge region has a width that is substantially constant at a first width in the waveguiding direction, the second ridge region has a width that is reduced from the first width to a second width in the waveguiding direction, the first stripe-shaped mesa includes a first mesa region and a second mesa region, the first and second mesa regions containing the one end and the other end of the first stripe-shaped mesa, respectively, the first mesa region has a width that is reduced from the second width to a third width in the waveguiding direction, the second mesa region has a width that is substantially constant at the third width in the waveguiding direction, and the second stripe-shaped mesa has a width that is substantially constant at the third width in the waveguiding direction.

7. The integrated semiconductor device according to claim 1, wherein the location with respect to the substrate at which the ridge portion and the first stripe-shaped mesa are connected is between the first portion and the second portion.

8. The integrated semiconductor device according to claim 1, wherein the ridge portion has a width smaller than a width of the base portion in a direction intersecting the waveguiding direction, the stripe shaped mesa is defined by a width of the second core layer, the second core layer having a smaller width than the first core layer in the first waveguide in the direction intersecting the waveguiding direction, and the second stripe-shaped mesa is defined by a width of the third core layer.

9. An integrated semiconductor device comprising:

a substrate including a first portion, a second portion, and a third portion that are arranged in a waveguiding direction, the substrate including a boundary between the second and third portions;

a first waveguide provided on the first portion, the first waveguide including a base portion and a ridge portion provided on the base portion, the base portion containing a first core layer, the ridge portion extending in the waveguiding direction;

a second waveguide provided on the second portion, the second waveguide including a first strip-shaped mesa containing a second core layer and extending in the waveguiding direction; and a third waveguide provided on the third portion, the third waveguiding including a second stripe-shaped mesa containing a third core layer and extending in the waveguiding direction, the third core layer being in a direct contact with the second core layer at a butt-jointed portion on the boundary between the second portion and the third portion, the third core layer and the second core layer being optically coupled to each other, wherein the first strip-shaped mesa is connected to the base portion and the ridge portion at one end of the first strip-shaped mesa, the first strip-shaped mesa is connected to the second stripe-shaped mesa at an other end of the first stripe-shape mesa, the second core layer is integral with the first core layer, the first core layer includes an active layer, the first waveguide constitutes a light-emitting portion so as to generate light in the active layer, the second waveguide constitutes a waveguide portion so as to propagate light from the first waveguide to the third waveguide, and the third waveguide constitutes an optical modulator portion so as to modulate light propogated from the first waveguide.

* * * * *